United States Patent [19]

Matsumoto et al.

[11] Patent Number: 5,057,885
[45] Date of Patent: Oct. 15, 1991

[54] MEMORY CELL SYSTEM WITH FIRST AND SECOND GATES

[75] Inventors: Hiroshi Matsumoto, Tokyo; Nobuyuki Yamamura, Hanno; Makoto Sasaki, Tokyo, all of Japan

[73] Assignee: Casio Computer Co., Ltd., Tokyo, Japan

[21] Appl. No.: 556,908

[22] Filed: Jul. 20, 1990

[30] Foreign Application Priority Data

Jul. 28, 1989 [JP] Japan ................. 1-19432
Jul. 28, 1989 [JP] Japan ................. 1-194034
Jul. 28, 1989 [JP] Japan ................. 1-194035
Jul. 28, 1989 [JP] Japan ................. 1-194036

[51] Int. Cl.$^5$ ............ H01L 29/68; H01L 29/34; G11C 11/34
[52] U.S. Cl. ................. 357/23.5; 357/54; 357/41; 365/184
[58] Field of Search ........... 357/23.5, 54; 365/184

[56] References Cited

U.S. PATENT DOCUMENTS

| 427,252 | 10/1989 | Kim . | |
| 467,736 | 1/1990 | Loke . | |
| 668,741 | 3/1991 | Ngo . | |
| 3,719,866 | 3/1973 | Naber et al. | 357/23.5 |
| 4,353,083 | 10/1982 | Trudel et al. | 357/23.5 |
| 4,460,980 | 7/1984 | Hagiwara et al. | 365/184 |
| 4,481,527 | 11/1984 | Chen et al. | 357/23.5 |
| 4,611,308 | 9/1986 | Lonky | 365/184 |
| 4,667,217 | 5/1987 | Janning | 357/54 |
| 4,686,558 | 8/1987 | Adam | 357/23.5 |
| 4,804,637 | 2/1989 | Smayling et al. | 357/23.5 |
| 4,821,092 | 4/1989 | Noguchi | 357/23.7 |
| 4,876,582 | 10/1989 | Janning | 357/54 |

Primary Examiner—William Mintel
Assistant Examiner—Robert P. Limanek
Attorney, Agent, or Firm—Frishauf, Holtz, Goodman & Woodward

[57] ABSTRACT

A memory element manufactured by a thin film forming technique is disclosed. The memory element includes a gate electrode, a gate insulating film, a semiconductor layer, a source electrode, and a drain electrode. The gate insulating film is divided into memory and non-memory regions so that a memory transistor and a selection transistor are apparently formed in one transistor. Therefore, the element formation area of each memory element can be reduced, and the packing density can be increased.

13 Claims, 20 Drawing Sheets

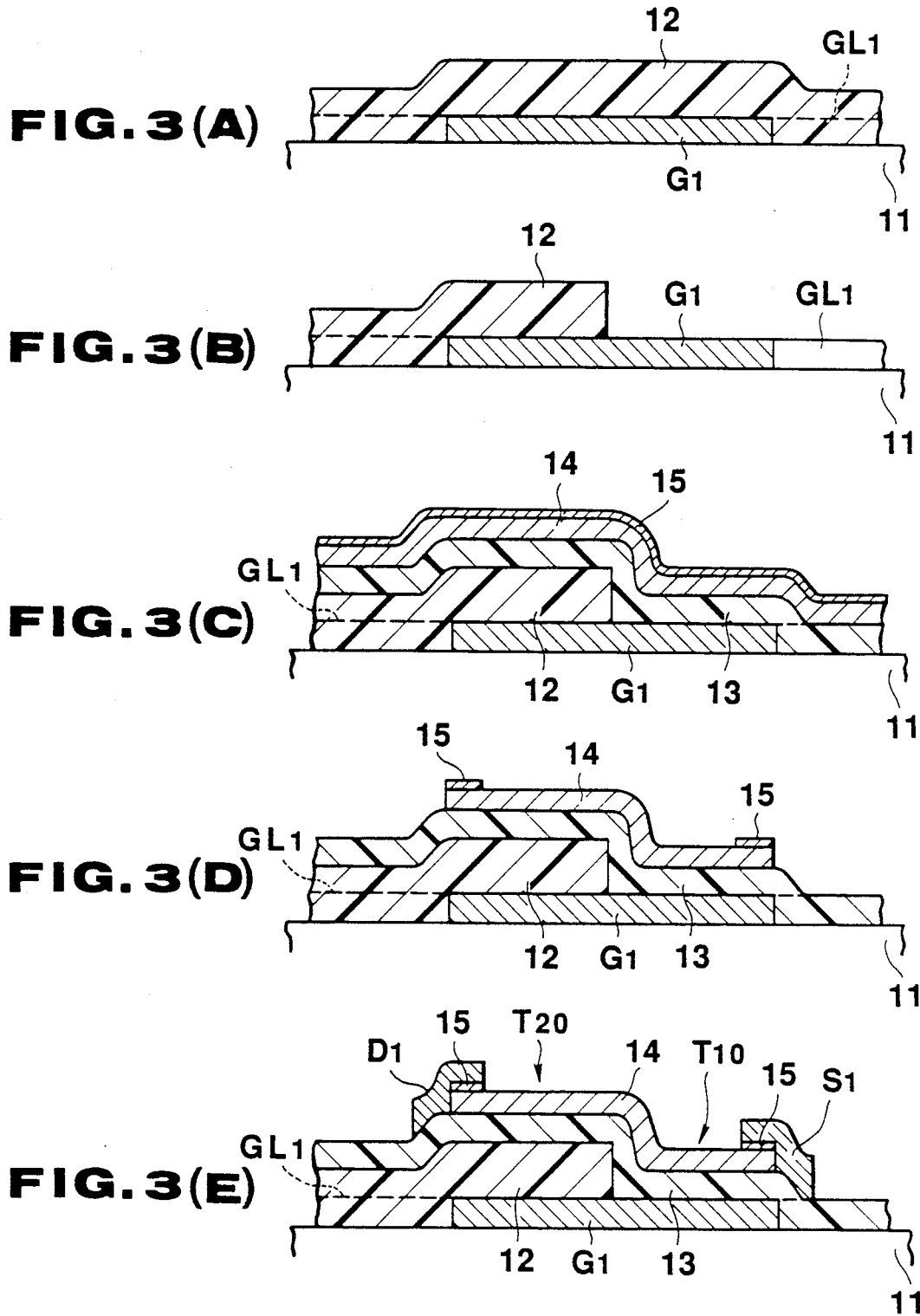

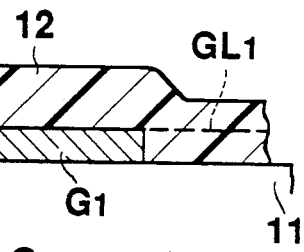
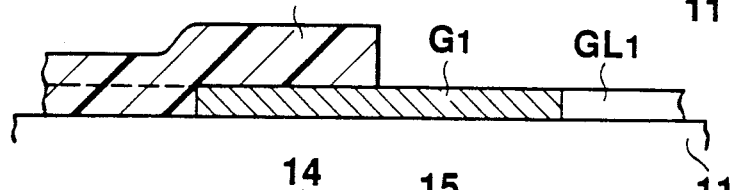
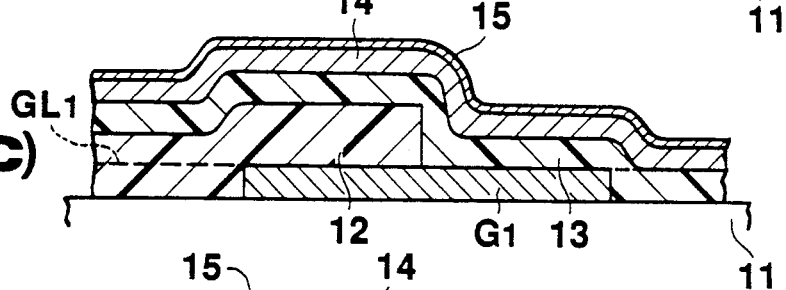
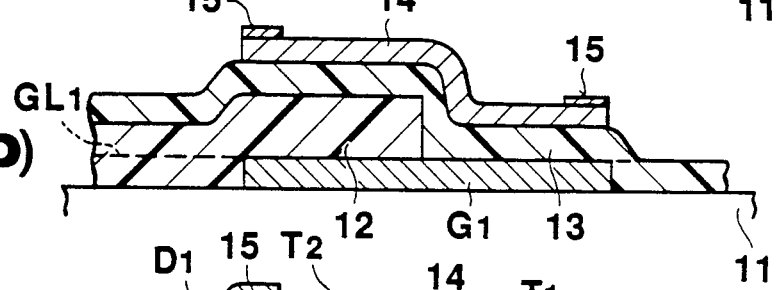
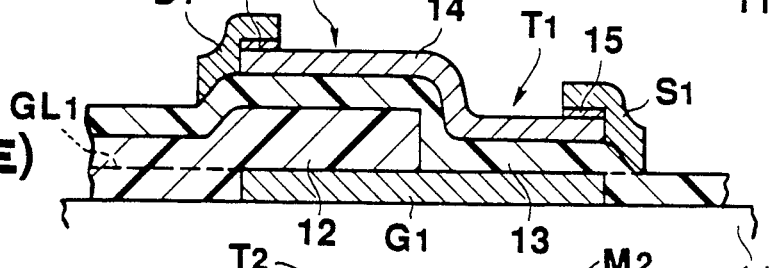
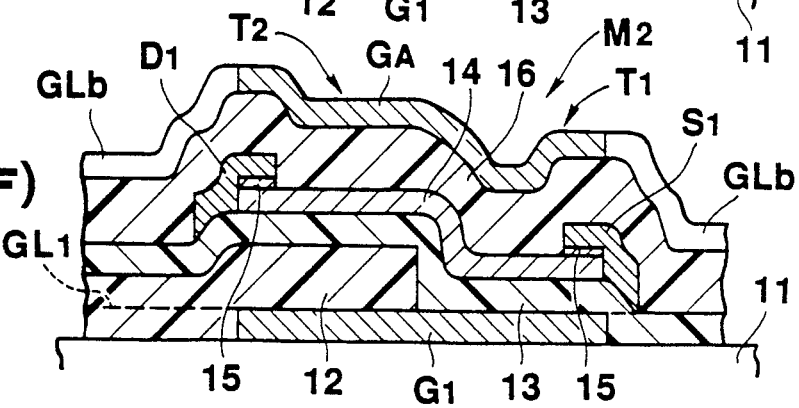

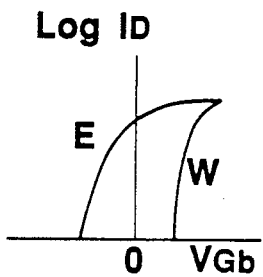
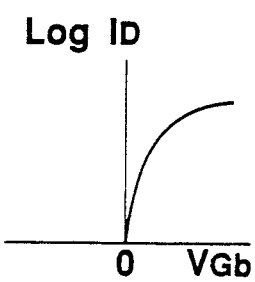
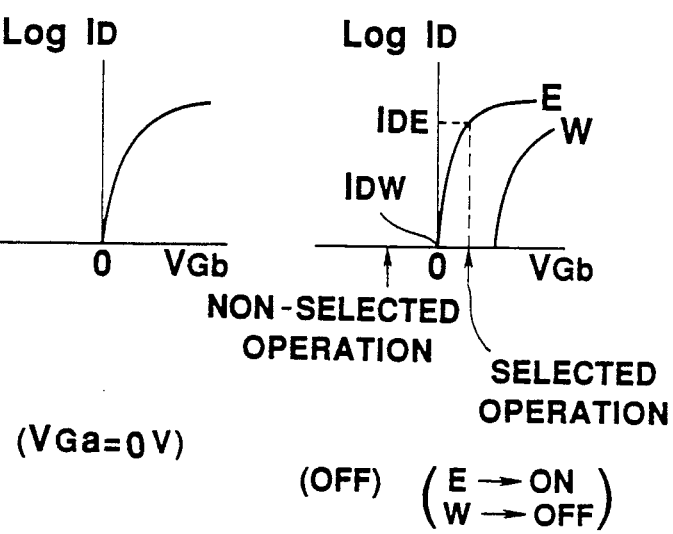
(VGa=0V)       (OFF)  (E→ON / W→OFF)
FIG.9(A)   FIG.9(B)   FIG.9(C)
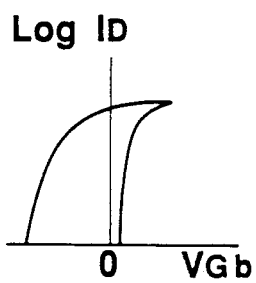
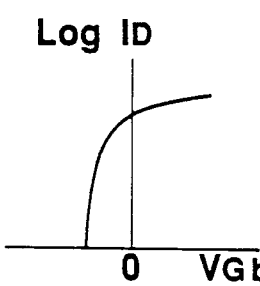
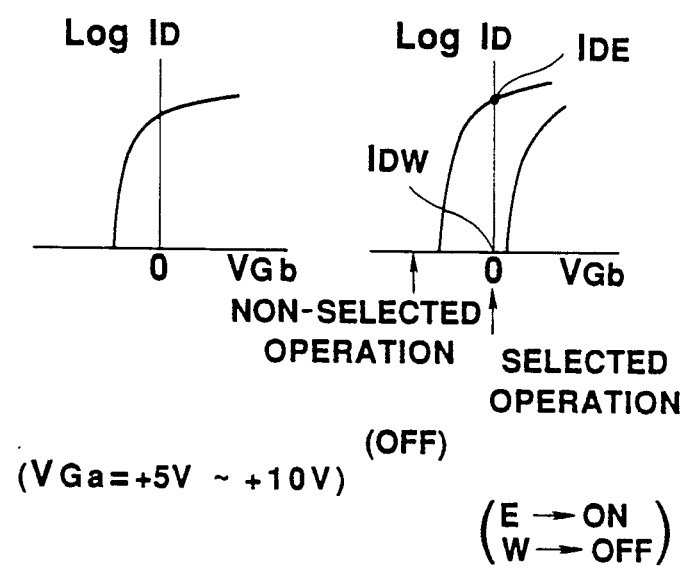
(VGa=+5V ~ +10V)  (OFF)  (E→ON / W→OFF)
FIG.10(A)   FIG.10(B)   FIG.10(C)

MEMORY CELL SYSTEM WITH FIRST AND SECOND GATES

BACKGROUND OF THE INVENTION

1. Field of the Invention

The present invention relates to a memory device using thin film transistors and a memory circuit employing the same.

2. Description of the Related Art

Recently, memory elements constituted by thin film transistors have been developed as memory elements for a memory device such as an EEPROM capable of electrically performing write, erase, and read operations.

Such a memory element is disclosed in, e.g., U.S. Ser. No. 427,252.

According to U.S. Ser. No. 427,252, one memory element is constituted by a memory transistor having a memory function and a selection transistor having no memory function, which are connected in series on an insulating substrate.

By ON/OFF-controlling the selection transistor, the corresponding memory transistor is selected, and data write, erase, or read operation is performed with respect to the selected memory transistor.

In this memory element, the memory and selection transistors consist of thin film transistors. Therefore, such memory elements can be easily manufactured at low manufacturing cost as compared with memory elements of widely used EEPROMs.

With the recent improvement in performance of electrical equipment and the like, however, memory devices used for such equipment are required to have a higher packing density at lower cost.

SUMMARY OF THE INVENTION

It is an object of the present invention to provide a memory element which allows a reduction in formation area thereof and greatly improves reliability, and a memory circuit using the same.

According to the present invention, there is provided a memory element comprising:

a substrate;
a gate electrode formed on said substrate;
a gate insulating film formed on said gate electrode;
a semiconductor layer formed on said gate insulating film;
and a source electrode and a drain electrode formed on said semiconductor layer,
wherein a region of said gate insulating film which corresponds to an activation region of said semiconductor layer is divided into a memory region and a non-memory region, a memory transistor is constituted by the memory region, the gate electrode, the semiconductor layer, the source electrode, and the drain electrode, and a selection transistor is constituted by the non-memory region, the gate electrode, the semiconductor layer, the source electrode, and the drain electrode.

With this arrangement, the formation area of each memory element can be reduced, and the reliability can be greatly improved.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3(A) to 3(E) are sectional views showing the steps in manufacturing the memory element in FIG. 1;

FIGS. 7(A) to 7(F) are sectional views showing the steps in manufacturing the memory element in FIG. 5;

FIGS. 9(A) to 9(C) and 10(A) to 10(C) are graphs each showing drain current characteristics with respect to a voltage applied to the read gate electrode of the memory element in FIG. 5;

DETAILED DESCRIPTION OF THE PREFERRED EMBODIMENTS

Embodiments of the present invention will be explained in more detail below.

First Embodiment

Figure 1:
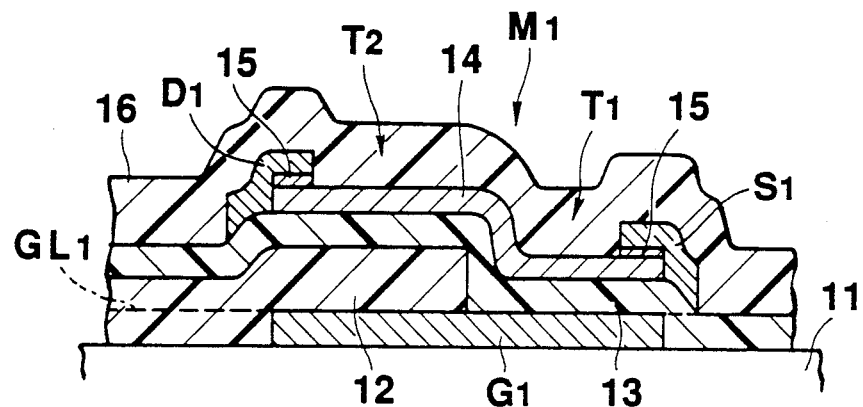
FIG. 1 is a sectional view of a memory element according to the first embodiment of the present invention.
Figure 2:
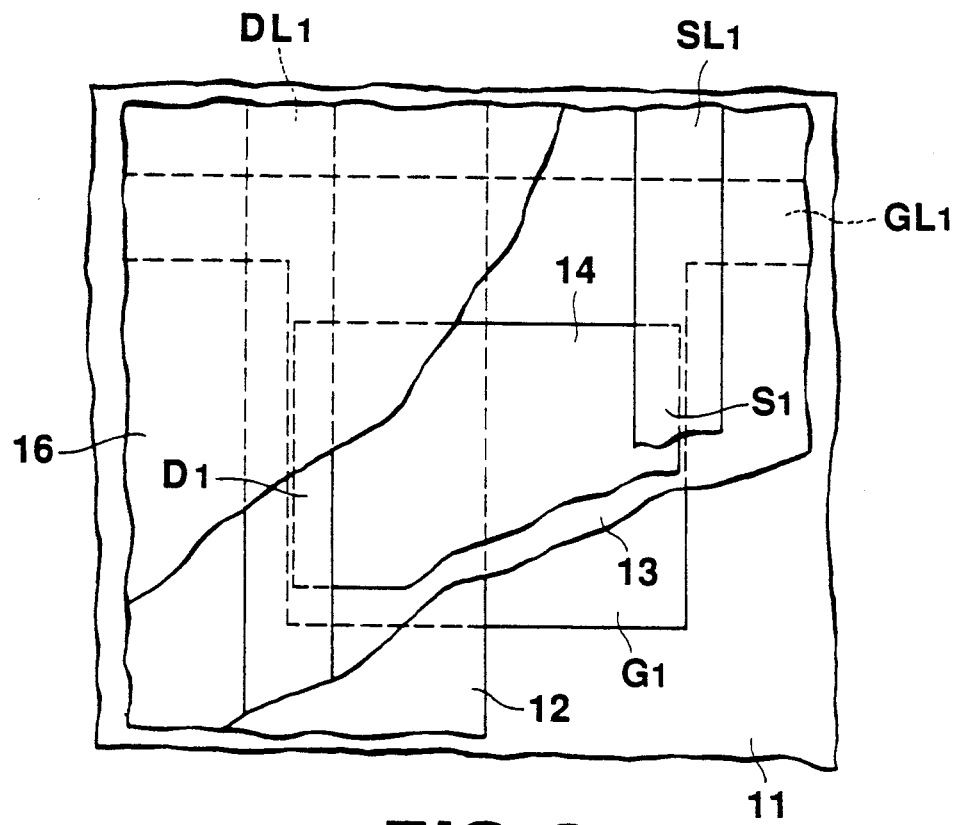
FIG. 2 is a plan view of the memory element in FIG. 1.

FIGS. 1 and 2 are sectional and plan views, respectively, of a memory element M1 of the present invention.

A structure of the memory element M1 will be described below. Referring to FIGS. 1 and 2, reference numeral 11 denotes an insulating substrate made of glass or the like. A gate electrode G1 and a gate line GL1 are formed on the substrate 11. The gate electrode G1 is commonly used for thin film transistors T1 and T2 respectively used as memory and selection transistors. The gate line GL1 is connected to the gate electrode G1. A first gate insulating film 12 consisting of silicon nitride is formed on the substrate 11 so as to cover almost a half of the gate electrode G1, i.e., the gate electrode portion of the selection transistor T2. In addition, a second gate insulating film 13 consisting of silicon nitride is formed on the resultant structure so as to cover the entire gate electrode G1. Each of the first and second gate insulating films 12 and 13 consists of silicon nitride having a composition ratio Si/N of silicon atoms Si to nitrogen atoms N which is almost equal to the stoichiometric ratio (Si/N=0.75). The thickness of the first gate insulating film 12 is set to be about 2,500 Å to 3,500 Å. The thickness of the second gate insulating film 13 is set to be about 500 Å to 1,500 Å. More specifically, the gate insulating films formed on the gate electrode G1 are designed such that the first and second insulating films 12 and 13 are formed on almost one half of the gate electrode G1, which corresponds to the selection transistor T2, so as to constitute a double layer, and only the second gate insulating film 13 is formed on the other half of the gate electrode G1, which corresponds to the memory transistor T1, so as to constitute a thin film. Since the second gate insulating film 13 corresponding to the memory transistor T1 is thin, it has a charge accumulating function, even though its composition ratio Si/N is almost equal to the stoichiometric ratio.

Note that the portion of the gate insulating films 12 and 13 corresponding to the selection transistor T2 is thick as a whole, it has no charge accumulating function. An i-type semiconductor layer 14 consisting of amorphous silicon or polysilicon is formed on the second gate insulating film 13 so as to oppose the entire gate electrode G1. The layer 14 is commonly used for the memory and selection transistors T1 and T2. Source and drain electrodes S1 and D1 are respectively formed on both side portions of the i-type semiconductor layer 14 through an n-type semiconductor layer 15 obtained by doping amorphous silicon or polysilicon doped with an n-type impurity. The source electrode S1 is connected to a source line SL1 integrated therewith. The drain electrode D1 is connected to a drain line DL1 integrated therewith. Note that reference numeral 16 denotes a protective insulating film covering the memory element M1.

That is, each memory element M1 is designed such that the memory transistor T1 and the selection transistor T2 are formed in one thin film transistor. The memory transistor T1 is constituted by the gate electrode G1, the second insulating film 13, the i- and n-type semiconductor layers 14 and 15, and the source and drain electrodes S1 and D1. The selection transistor T2 is constituted by the gate electrode G1, the first and second gate insulating films 12 and 13, the i-and n-type semiconductor layers 14 and 15, and the source and drain electrodes S1 and D1.

FIGS. 3(A) to 3(E) show a method of manufacturing the memory element M1. The memory element M1 is manufactured in the following steps.

A metal film consisting of chromium or the like is formed on the substrate 11. The metal film is then patterned to simultaneously form the gate electrode G1 and the gate line GL1 connected thereto, and the first gate insulating film 12 is deposited o the resultant structure throughout the upper surface of the substrate 11, as shown in FIG. 3(A).

As shown in FIG. 3(B), a portion of the first gate insulating film 12, ranging from substantially the middle of the gate electrode G1 to one edge of the film 12, is removed by etching so as to expose a portion of the gate electrode G1 corresponding to the memory transistor T1.

As shown in FIG. 3(C), the second gate insulating film 13 is deposited on the resultant structure throughout the entire upper surface of the substrate 11. The i-type semiconductor layer 14 consisting of amorphous silicon or polysilicon and the n-type semiconductor layer obtained by amorphous silicon or polysilicon doped with an n-type impurity are sequentially deposited on the resultant structure.

As shown in FIG. 3(D), the n-type semiconductor layer 15 is patterned in the form of the source and drain electrodes S1 and D1. The i-type semiconductor layer 14 is then patterned in the form of a memory element region.

Subsequently, a metal film consisting of chromium or the like used for the source and drain electrodes S1 and D1 is deposited on the resultant structure throughout the entire upper surface of the substrate 11. This metal film is patterned to form the source electrode S1, the source line SL1, the drain electrode D1, and the drain line DL1, as shown in FIG. 3(E). The protective insulating film 16 is then formed on the resultant structure. With this process, the thin film transistor memory shown in FIGS. 1 and 2 is completed.

Since the memory element M1 of this embodiment is designed such that the memory and selection transistors T1 and T2 are formed in one thin film transistor, the element area can be greatly reduced. Therefore, the packing density can be increased, and the manufacturing cost can be decreased. An actual operation of a circuit will be described below, in which the memory elements M1 are incorporated in the form of a matrix.

Figure 4A:
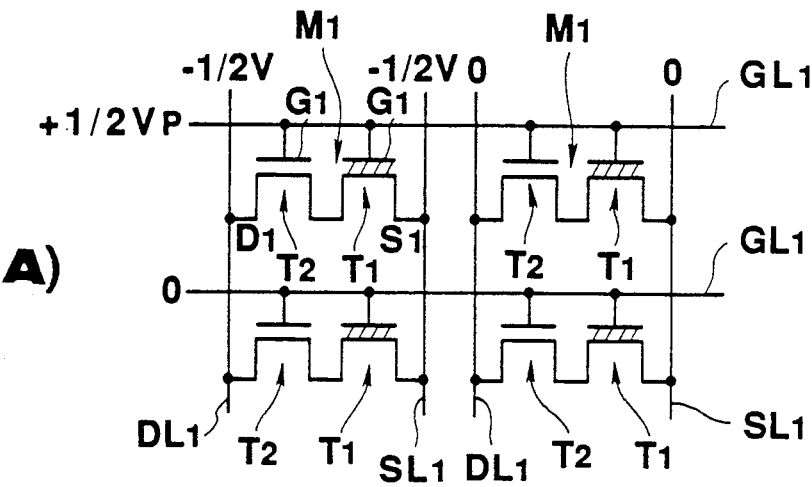
FIGS. 4(A) to 4(C) are circuit diagrams showing a matrix circuit of memory elements each of which is identical to the memory element in FIG. 1.
Figure 4B:
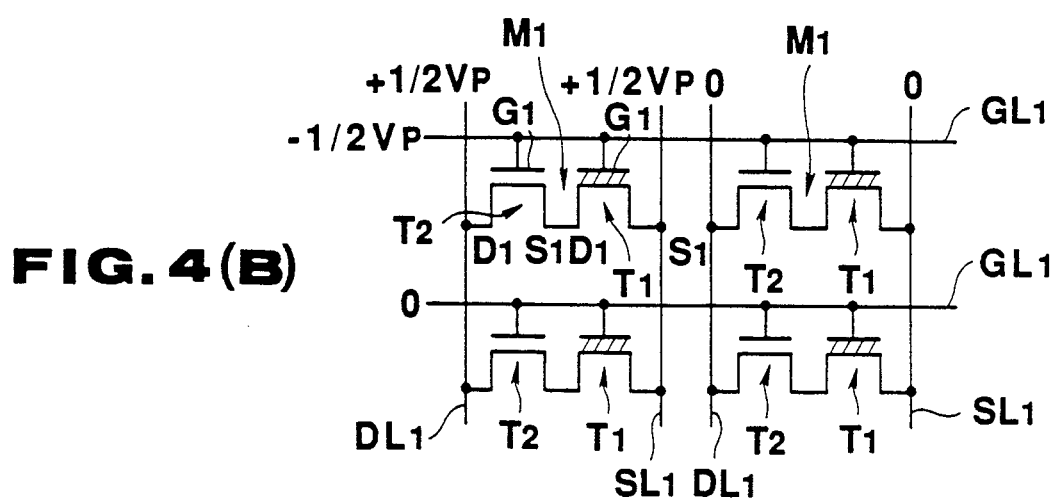
Figure 4C:
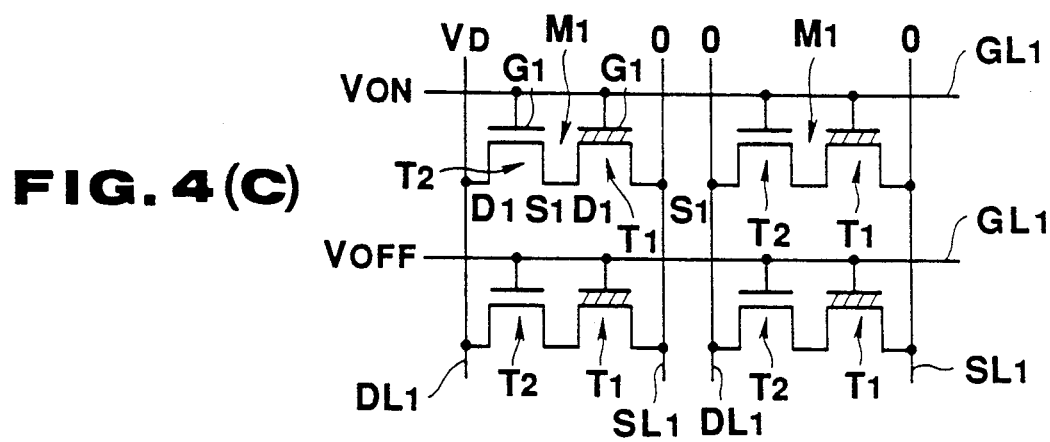

FIGS. 4(A) to 4(C) are circuit diagrams showing a circuit in which the memory element M1 are incorporated in the form of a 2×2 matrix.

Referring to FIGS. 4(A) to 4(C), reference numeral T1 denotes the memory transistor; and T2, the selection transistor. The source electrode S1 of each selection transistor T2 is integrated with the drain electrode D1 of each memory transistor T1 paired therewith. One memory element M1 is constituted by a pair of memory and selection transistors T1 and T2. In addition, reference symbols GL1 denote the gate lines (address lines); and SL1 and DL1, the source and drain lines (data lines). The gate lines GL1 and the source and drain lines SL1 and DL1 are perpendicular to each other in the form of a matrix. The memory elements M1 are respectively arranged at intersections defined by the gate lines GL1 and the source and drain lines SL1 and DL1. The gate electrode G1 of each memory transistor T1 and the gate electrode G1 of the corresponding selection transistor T2 are connected to the corresponding common gate line GL1. The source electrode S1 of each memory transistor T1 is connected to the corresponding source line SL1, and the drain electrode D1 of each selection transistor T2 is connected to the corresponding drain line DL1.

Write, erase, and read operations of the memory elements M1 are performed in the following manner.

FIGS. 4(A) to 4(C) respectively show voltage application states in write, erase, and read modes. Note that each of FIGS. 4(A) to 4(C) shows a state wherein the upper left memory element M1 in the drawing is to be selected.

A write operation will be described first. In the write mode, as shown in FIG. 4(A), a positive voltage $+\frac{1}{2}$ VP (+20 V) corresponding to $\frac{1}{2}$ a write/erase voltage VP (e.g., 40 V) is applied to the gate line GL1 to be selected. At the same time, a negative voltage $-\frac{1}{2}$ VP (−20 V) corresponding to $\frac{1}{2}$ the write/erase voltage Vp is applied to each of the source and drain lines SL1 and DL1 to be selected. In addition, the potentials of the non-selected gate line GL1 and the non-selected source and drain lines SL1 and DL1 are set to be zero (grounded). Upon application of such voltage signals, the selection transistor T2 of the selected memory element M1 at the intersection defined by the selected gate line GL1 and the source and drain lines SL1 and DL1 is turned on. A potential difference corresponding to the write/erase voltage $V_p$ is then generated between the gate and the source and drain of the memory transistor T1. As a result, the memory transistor T1 is set in a write enable state. In another non-selected memory element M1 on the selected gate line GL1, a potential difference of $-1/8$ $V_p$ is present between the gate and the source and drain of each of the memory and selection transistors T1 and T2, and hence the memory transistor T1 is set in a write disable state. With regard to the memory elements on the non-selected line GL1, the lower left memory element in FIG. 4(A) has a potential difference of $\frac{1}{2}$ $V_p$ generated be the gate and the source and drain of the memory T1, similar to the above-described non-memory element M1, and hence the memory transistor T1 is set in a write disable state. In addition, in lower right memory element in FIG. 4(A), similar to above non-selected memory element M1, the potential difference between the gate and the source and drain of the memory transistor T1 is set at 0 (no voltage application). That is, the gate and the source and drain of the transistor T1 are set at the same potential. Therefore, this memory transistor T1 is also is set in a write disable state.

In the erase mode, as shown in FIG. 4(B), a voltage $-\frac{1}{2}$ $V_p$ is applied to the gate line GL1 to be selected. At the same time, a voltage $+\frac{1}{2}$ $V_p$ is applied to each of the source and drain lines SL1 and DL1 to be selected. Note that the same voltage signals as in the write mode are applied to the non-selected gate line GL and the source and drain lines SL1 and DL1. Upon application of such voltage signals, a potential difference corresponding to the write/erase voltage $V_P$ but having a polarity opposite to it is generated between the gate and the source and drain of the memory transistor T1 of the selected memory element M1. As a result, data held in this memory transistor T1 is erased. Similar to the write mode, in this case, only a potential difference of $\frac{1}{2}$ $V_P$ is generated between the gate and the source and drain of the memory transistor T1 of the non-selected memory element M1, and hence this memory transistor T1 is set in an erase disable state.

In the read mode, as shown in FIG. 4(C), a voltage $V_{ON}$ is applied to the gate line GL1 to be selected. At the same time, a voltage $V_D$ is applied to the drain line DL1 to be selected, and the potential of the source line SL1 is set at 0. Note that the voltages $V_{ON}$ and $V_D$ are sufficiently lower than the write/erase voltage $V_P$ (40 V), and are set as, e.g., $V_{ON}=10$ V and $V_D=10$ V.

In addition, a voltage $V_{OFF}$ (0 V) is applied to the non-selected gate line GL1, and the potentials of the non-selected source and drain lines SL1 and DL1 are set to be 0. Upon application of such voltage signals, a current flows from the drain line DL1 to the source line SL1 in accordance with data held in the memory transistor T1 of the selected memory element M1, and is output as readout data.

In either of the write, erase, and read modes, the voltages applied to the selected source and drain lines SL1 and DL1 are also applied to the non-selected memory elements M1 on the selected source and drain lines SL1 and DL1. However, since the selection transistor T2 of each of the non-selected memory elements M1 has a gate potential of $-\frac{1}{2}$ $V_P$ or $V_{OFF}$, i.e., is turned off, the transistor T1 of each of the non-selected memory elements is not influenced by the applied voltages. That is, the selection transistor T2 serves not only as a transistor for selecting the memory transistor T1 but also as a guard transistor for guarding the memory transistor T1 from a voltage applied in a non-selection period.

The above-described matrix circuit is designed such that the gate electrodes G1 of each memory transistor T1 and the corresponding selection transistor T2 are connected to the corresponding common gate line GL1, and signals are applied to the gate electrodes G1 of the memory transistor T1 and the selection transistors T2 through the common gate line GL1.

Assume that the above-described memory element M1 is used for a memory device. In all data write, erase, and read operations, voltages of predetermined levels corresponding to the respective operations are applied to the gate electrode G1. For this reason, if a read operation is repeated, the threshold voltage of the memory transistor T1 may be changed. When the number of read operations exceeds several tens times, a stable read operation may not be performed.

In order to stabilize a read operation, an attempt is made to form a read gate electrode arranged independently of the gate electrode G1. According to this attempt, in the read mode, a voltage of a predetermined level is applied to this read gate electrode in order to read out data.

Such an attempt is disclosed in U.S. Ser. No. 467,736 filed by the present applicant. If this attempt is applied to the present invention, a memory element with a stable read operation can be obtained.

Figure 5:
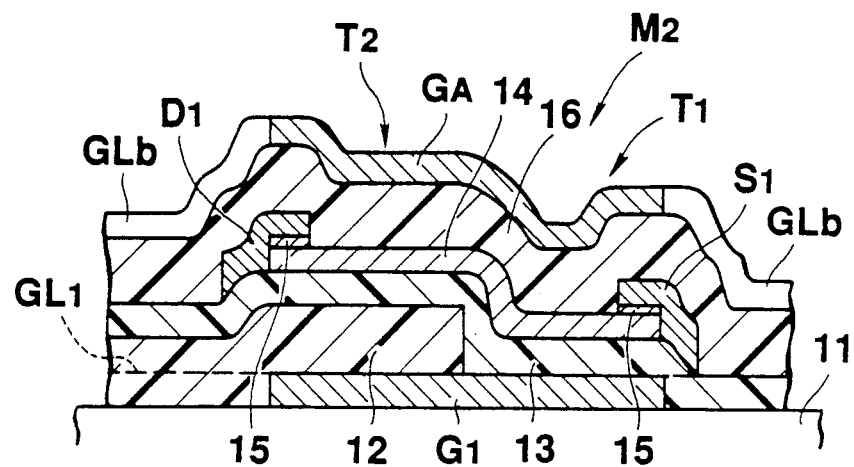
FIG. 5 is a sectional view of a memory element obtained by forming a read gate electrode on the memory element of the first embodiment.
Figure 6:
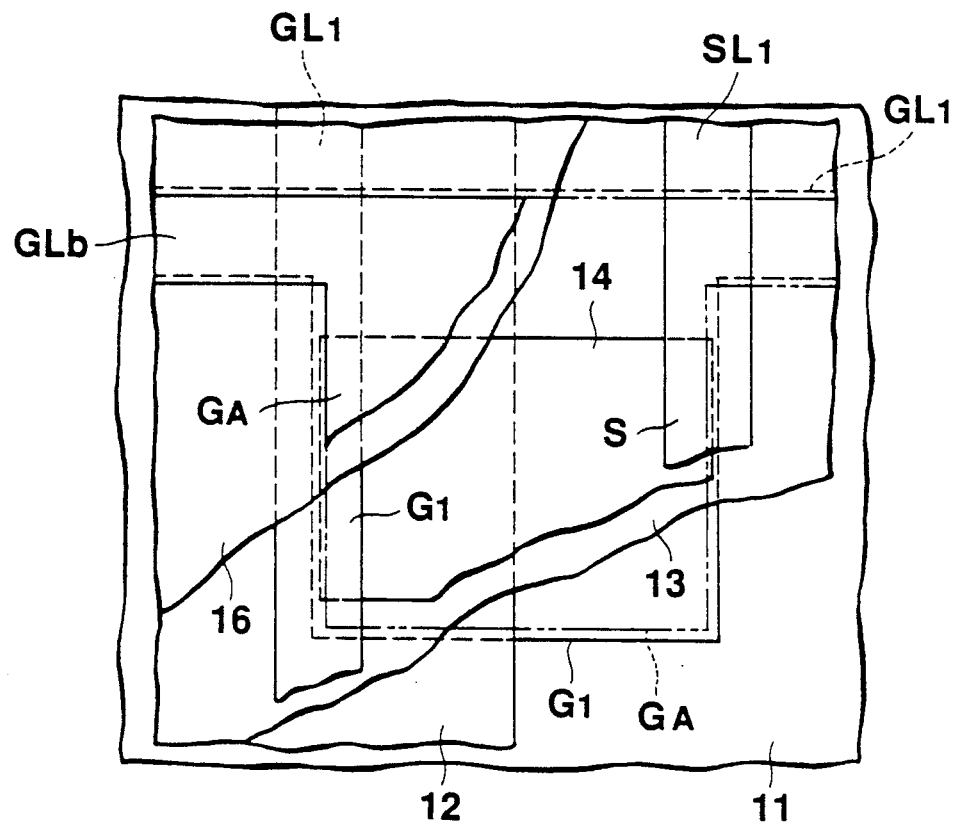
FIG. 6 is a plan view of the memory element in FIG. 5.

FIGS. 5 and 6 are sectional and plan views, respectively, of a memory element M2 including a read gate electrode. Each memory element M2 is obtained by forming a read gate electrode GA on the memory element M1 shown in FIGS. 1 and 2. Since the memory element M2 has the same structure as that of the memory element M1 except for the read gate electrode GA, the same reference numerals in FIGS. 5 and 6 denote the same parts as in FIGS. 1 and 2, and a description thereof will be omitted.

Referring to FIGS. 5 and 6, reference numeral 16 denotes a protective insulating film. The respective layers stacked under the protective insulating film 16 are the same as those in FIGS. 1 and 2.

The read gate electrode GA and a read gate line GLb are formed on the protective insulating film 16. The read gate electrode GA commonly used for a memory transistor T1 and a selection transistor T2. The read gate line GLb is connected to the read gate electrode GA. The read gate line GLb is arranged right above a write/erase gate line GL1.

FIGS. 7(A) to 7(F) show the steps in manufacturing the memory element M2 including the read gate electrode GA.

Since the steps shown in FIGS. 7(A) to 7(E) are the same as those shown in FIGS. 3(A) to 3(E), a description thereof will be omitted.

After a source electrode S1, a source line SL1, a drain electrode D1, and a drain line DL1 are formed as shown in FIG. 7(E), the protective insulating film 16 and a metal film consisting of chromium or the like are sequentially stacked on the resultant structure, as shown in FIG. 7(F). The metal film is then patterned to form the read gate electrode GA and the read gate line GL1, thus completing the memory element M2.

As described above, the memory element M2 is obtained by forming the read gate electrode on the memory element M1. When data is to be read out from the memory element M2, a voltage of a predetermined level is applied to the read gate electrode. Therefore, even with repetitive read operations, the threshold voltage of the memory transistor is not changed, and a stable read operation can be performed.

An actual operation of a circuit will be described below, in which the memory elements M2 are incorporated in the form of a matrix.

Figure 8A:
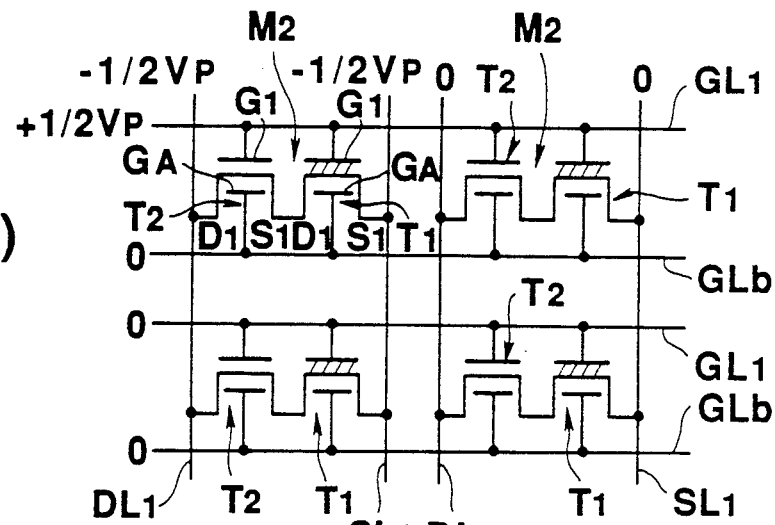
FIGS. 8(A) to 8(C) are circuit diagrams showing a matrix circuit of memory elements each of which is identical to the memory element in FIG. 5.
Figure 8B:
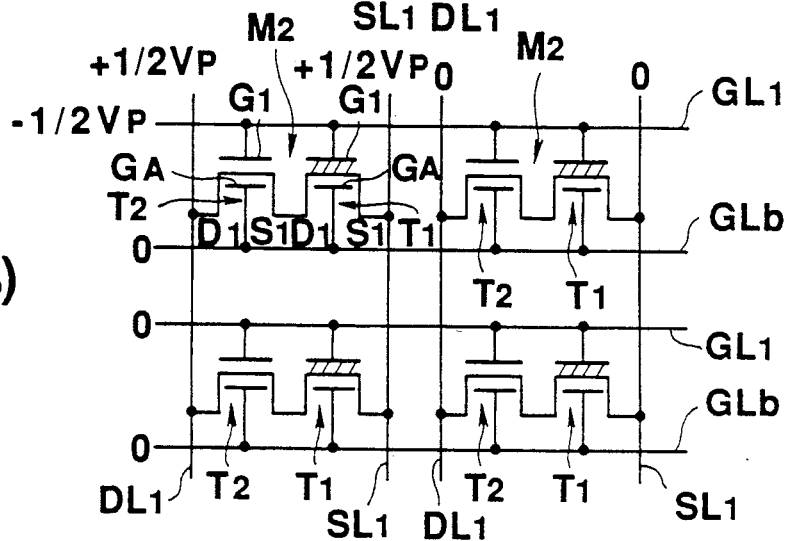
Figure 8C:
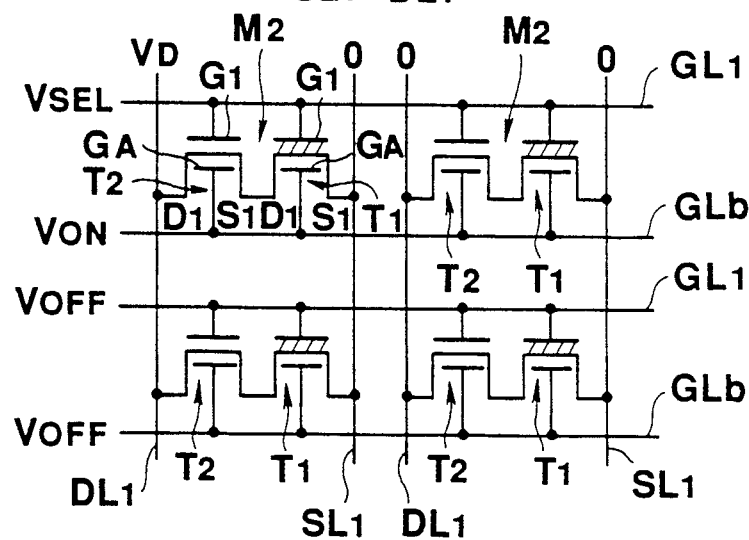

FIGS. 8(A) to 8(C) are circuit diagrams showing a circuit in which the memory elements M2 are incorporated in the form of a 2×2 matrix.

Referring to FIGS. 8(A) to 8(C), reference symbol T1 denotes the memory transistor; and T2, the selection transistor.

In each memory element, gate electrodes G1 of the memory and selection transistors T1 and T2 are used as write/erase gate electrodes, and the read gate electrodes GA are formed on the opposite side to these electrodes G1. The source electrode S1 of each selection transistor T2 is integrated with the drain electrode D1 of the corresponding memory transistor T1 paired therewith. One memory element M2 is constituted by a pair of memory and selection transistors T1 and T2. In addition, reference symbol GL1 denotes the write/erase gate line (address line); GLb, the read gate line (address line); and SL1 and DL1, source and drain lines (data lines), respectively. The gate lines GL1 and GLb and the source and drain lines SL1 and DL1 are perpendicular to each other in the form of a matrix. The memory elements M2 are respectively arranged at intersections defined by the gate lines GL1 and GLb and the source and drain lines SL1 and DL1. The write/erase gate electrodes G1 of each pair of memory and selection transistors T1 and T2 are connected to the corresponding common write/erase gate line GL1. The read gate electrodes GA of each pair of memory and selection transistors T1 and T2 are connected to the corresponding common read gate line GLb. In addition, the source electrode S1 of each memory transistor T1 is connected to the corresponding source line SL1, and the drain electrode D1 of each selection transistor T2 is connected to the corresponding drain line DL1.

Write, erase, and read operations of this thin film transistor memory are performed in the following manner.

FIGS. 8(A) to 8(C) respectively show voltage application states in write, erase, and read modes. Note that each of FIGS. 8(A) to 8(C) shows a state wherein the upper left memory element M2 in the drawing is to be selected.

A write operation will be described first. In the write mode, as shown in FIG. 8(A), a positive voltage of $+\frac{1}{2}$ Vp (+20 V) corresponding to $\frac{1}{2}$ write/erase voltage Vp (e.g., 40 V) of the memory transistor T1 is applied to the write/erase gate line GL1 of the gate lines GL1 and GLb to be selected. At the same time, the potential of the read gate line GLb is set to be 0 (grounded), and a negative voltage of $-\frac{1}{2}$ Vp (−20 V) corresponding to $\frac{1}{2}$ the write/erase voltage Vp is applied to each of the source and drain lines SL1 and DL1 to be selected. In addition, the potentials of the non-selected gate lines GL1 and GLb and the non-selected source and drain lines SL1 and DL1 are set to be 0. When such voltage signals are applied, the selection transistor T2 of the selected memory element M2 at the intersection defined by the selected gate lines GL1 and GLb and the selected source and drain lines SL1 and DL1 is turned upon voltage application to the write/erase gate electrode G1. As a result, a potential difference corresponding to the write/erase voltage Vp is generated between the write/erase gate electrode G1 and the source and drain electrodes S1 and D1 of the memory transistor T1, thus setting the memory transistor T1 in a write enable state. In another non-selected memory element M2 on the selected gate lines GL1 and GLb, since only a potential difference of $\frac{1}{2}$ Vp is present between the write/erase gate electrode G1 and the source and drain electrodes S1 and D1 of the selection transistor T2, the memory transistor T1 is set in a write disable state. With regard to the memory elements on the non-selected gate lines GL1 and GLb, the lower left memory element in FIG. 8(A) has only a potential difference of $\frac{1}{2}$ Vp generated between the write/erase gate electrode G1 and the source and drain electrodes S1 and D1 of the memory transistor T1, similar to the above-described non-selected memory element M2, and hence the memory transistor T1 is set in a write disable state. In the lower right memory element in FIG. 8(A), similar to the above non-selected memory element M2, the potential difference between the write/erase gate electrode G1 and the source and drain electrodes S1 and D1 of the memory transistor T1 is 0 (no voltage application). That is, the gate and the source and drain of the memory transistor T1 have the same potential. Therefore, this memory transistor T1 is set in a write disable state.

In the erase mode, as shown in FIG. 8(B), a voltage of $-\frac{1}{2}$ Vp is applied to the write/erase gate line GL1 of the gate lines GL1 and GLb to be selected. At the same time, the potential of the read gate line GLb is set to be 0, and a voltage of $+\frac{1}{2}$ Vp is applied to each of the source and drain lines SL1 and DL1 to be selected. Note that the same voltage signals as those in the write mode are applied to the non-selected gate lines GL1 and GLb and the non-selected source and drain lines SL1 and DL1. Upon application of such voltage signals, a potential difference corresponding to the write/erase voltage Vp and having a polarity opposite to it is generated between the write/erase gate electrode G1 and the source and drain electrodes S1 and D1 of the memory transistor T1 of the selected memory element M2. At this time, similar to the memory transistor T1, a voltage $-Vp$ is applied between the gate electrode G1 and the source and drain electrodes S1 and D1 of the selection transistor T2. In a thin film transistor having a semiconductor layer consisting of amorphous silicon or polysilicon, even if a high negative voltage is applied to the gate electrode, the source-drain path is normally rendered conductive. That is, the thin film transistor is turned on. Therefore, the selection transistor T2 is turned on by a high negative voltage $-Vp$, and data held in the memory transistor T1 is erased. In this case, since the potential difference between the write/erase gate electrode G1 and the source and drain electrodes S1 and D1 of the memory transistor T1 of the non-selected memory element M2 is also set to be $\frac{1}{2}$ Vp, the memory transistor T1 is in an erase disable state.

In the read mode, as shown in FIG. 8(C), a voltage $V_{ON}$ is applied to the read gate line GLb of the gate lines GL1 and GLb to be selected, and a voltage $V_{SEL}$ is applied to the write/erase gate line GL1. At the same time, a voltage VD is applied to the drain line DL1, and the potential of the source line SL1 is set to be 0. Note that the voltages $V_{ON}$ and $V_D$ are sufficiently lower than the write/erase voltage Vp (40 V) of the memory transistor T1, and are set as, e.g., $V_{ON}=10$ V and $V_D=10$ V. The voltage $V_{SEL}$ is set to be, e.g., 0 V. In addition, a voltage $V_{OFF}$ (e.g., 0 V) is applied the non-selected read gate line GLb and write/erase gate GL1, and the potentials of the non-selected source and drain lines SL1 and DL1 are set to be 0. Upon application of such voltage signals, since the selection transistor T2 of the selected memory element M2 is turned on by the voltage $V_{ON}$ applied to the read gate line GLb, a current flows from the drain line DL1 to the source line SL1 in accordance with data held in the memory transistor T1, and is output as readout data. In this case, since the memory and selection transistors T1 and T2 are connected in series with each other, the characteristics of a drain current $I_D$ with respect to a voltage $V_{Gb}$ applied to the read gate electrode GA of the selected memory element M2 ($V_{Gb}-I_D$ characteristics) are equivalent to the total characteristics of the respective transistors T1 and T2. Therefore, the readout data is determined by the total characteristics of the respective transistors T1 and T2. FIGS. 9(A) to 9(C) show the $V_{Gb}-I_D$ characteristics of the selected memory element M2 obtained when a voltage $V_{Ga}$ to be applied to the write/erase gate electrode G1 is set to be 0 V. FIG. 9(A) shows the $V_{Gb}-I_D$ characteristics of the memory transistor T1; FIG. 9(B), the $V_{Gb}-I_D$ characteristics of the selection transistor T2; and FIG. 9(C), the total $V_{Gb}-I_D$ characteristics of the respective transistors T1 and T2. Referring to FIGS. 9(A) to 9(C), reference symbol W denotes characteristics in a write state; and E, characteristics in an erase state. While the memory element M2 is read-selected, the drain current $I_D$ becomes a current $I_{DE}$ when the memory transistor T1 is in an erase state, and becomes a current $I_{DW}$ (0 A) when the memory transistor T1 is in a write state. That is, in a selected operation, the memory element M2 is turned on in an erase state, and is turned on in a write state. Note that in a non-selected operation, since the selection transistor T2 is turned off by the voltage $V_{OFF}$ applied to the write/erase gate line GL1, the memory element M2 is set in an OFF state regardless of an erase or write state. FIGS. 10(A) to 10(C) show the $V_{Gb}-I_D$ characteristics of the selected memory element M2 obtained when the voltage $V_{Ga}$ to be applied to the write/erase gate electrode G1 is set to be $+5$ V to $+10$ V (a voltage low enough to cause no change in erase or write state of the memory transistor T1). FIG. 10(A) the $V_{Gb}-I_D$ characteristics of the memory transistors T1; FIG. 10(B), the $V_{Gb}-I_D$ characteristics of the selection transistor T2; and FIG. 10(C), the total $V_{Gb}-I_D$ characteristics of the respective transistors T1 and T2. If a voltage of a certain value ($+5$ V to $+10$ V) is applied to the write/erase gate electrode G1, the $V_{Gb}-I_D$ characteristics of the memory and selection transistors T1 and T2 are shifted to the negative side, and hence the total $V_{Gb}-I_D$ characteristics are shifted to the negative side. Therefore, the drain current $I_{DE}$ can be increased while the memory transistor T1 is in an erase state. Note that in a selected or non-selected operation, a voltage to be applied to the read gate line GLb is also shifted to the negative side by the shift amount of the $V_{Gb}-I_D$ characteristics.

In addition, in either of the above-described write, erase, and read operations, the voltage applied to the selected source and drain lines SL1 and DL1 is also applied to the source and drain lines SL1 and DL1 of the non-selected memory element M2. However, since the gate potential of the selection transistor T2 of the non-selected memory element M2 is $-\frac{1}{2}$ Vp or $V_{OFF}$ (0 V), the selection transistor T2 is in an OFF state. Therefore, the memory transistor T1 of the non-selected memory element M2 is not influenced by the applied voltage. That is, in this thin film transistor memory, the above-described selection transistor T2 serves not only as a transistor for selecting the memory transistor T1, but also as a guard transistor for guarding the memory transistor T1 from voltages to be applied to the memory transistor during a non-selection operation as well as a selection operation.

As described above, according to this embodiment, since memory and selection transistors are formed in one thin film transistor, the element area can be greatly reduced. Since no large substrates are required, lower manufacturing cost and a higher packing density can be realized.

Second Embodiment

The second embodiment of the present invention will be described below.

Figure 11:
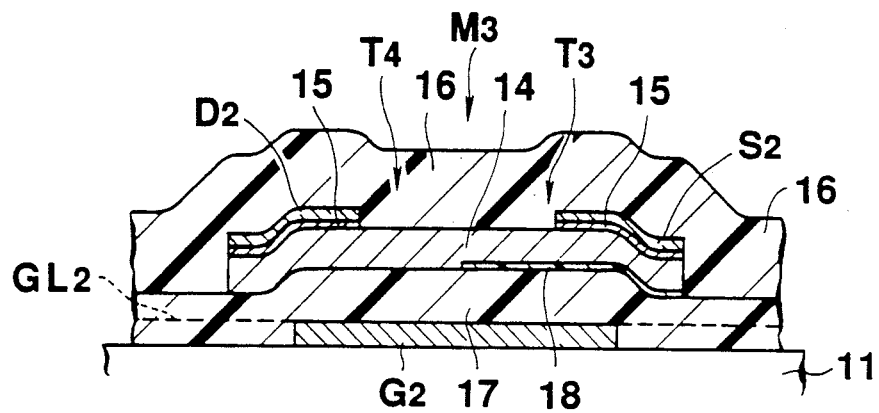
FIG. 11 is a sectional view of a memory element according to the second embodiment of the present invention.

FIG. 11 and 12(A) to 12(D) show the second embodiment of the present invention. FIG. 11 is a sectional view of a memory element M3 of a thin film transistor memory. Note that the same reference numerals in FIG. 11 denote the same parts as in FIG. 1 showing the first embodiment, and a description thereof will be omitted.

The memory element M3 of this embodiment is designed as follows. A gate insulating film of a memory transistor T3 is formed as a double layer consisting of a non-memory insulating film 17 and a memory insulating film 18. The insulating film 17 consists of silicon nitride (SiN) whose composition ratio Si/N (Si/N=0.75) is set to be almost equal to the stoichiometric ratio so as not to have a charge accumulating function. The insulating film 18 consists of silicon nitride whose composition ratio Si/N (Si/N=0.85 to 1.15) is set to be larger than the stoichiometric ratio so as to have a charge accumulating function. A gate insulating film of a selection transistor T4 is constituted by only the non-memory insulating film 17. The above-mentioned non-memory insulating film 17 covers the entire region of a gate electrode G2 commonly used for the memory and selection thin film transistors T3 and T4. The memory insulating film 18 is formed on the non-memory insulating film 17 so as to correspond to a portion of the gate electrode G2 which is to be formed into a gate electrode of the memory transistor T3 (in FIG. 11, almost a half of the gate electrode G2). Note that the non-memory insulating film 17 has a thickness of about 2,000 Å, and the memory insulating film 18 has a very small thickness of about 100 Å. The memory transistor T3 comprises the gate electrode G2, the gate insulating film consisting of the non-memory insulating film 17 and the memory insulating film 18, i- and n-type semiconductor layers 14 and 15, and source and drain electrodes S2 and D2. The selection transistor T4 comprises the gate electrode G2, the gate insulating film consisting of the non-memory insulating film 17, the i- and n-type semiconductor layers 14 and 15, and the source and drain electrodes S2 and D2.

FIGS. 12(A) to 12(D) show the steps in manufacturing the memory element M3. The memory element M3 is manufactured in the following steps.

Figure 12A:
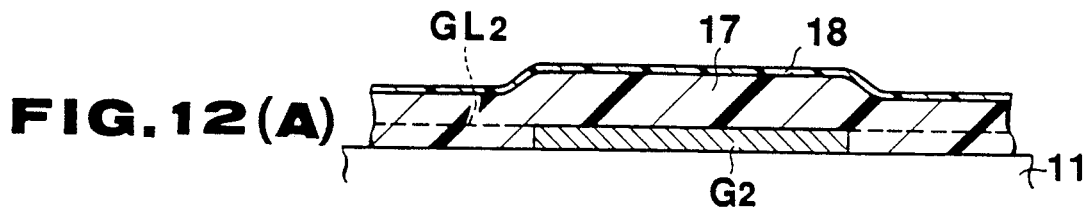
FIGS. 12(A) to 12(D) are sectional views showing the steps in manufacturing the memory element in FIG. 11.

A metal film consisting of chromium or the like is formed on a substrate 11. As shown in FIG. 12(A), the metal film is then patterned to simultaneously form the gate electrode G2 and a gate line GL2 connected thereto, and the non-memory insulating film 17 and the memory insulating film 18 are sequentially deposited on the resultant structure throughout the upper surface of the substrate 11.

Figure 12B:
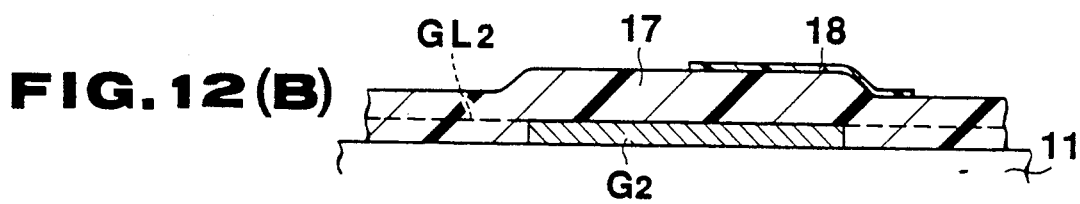
Figure 12C:
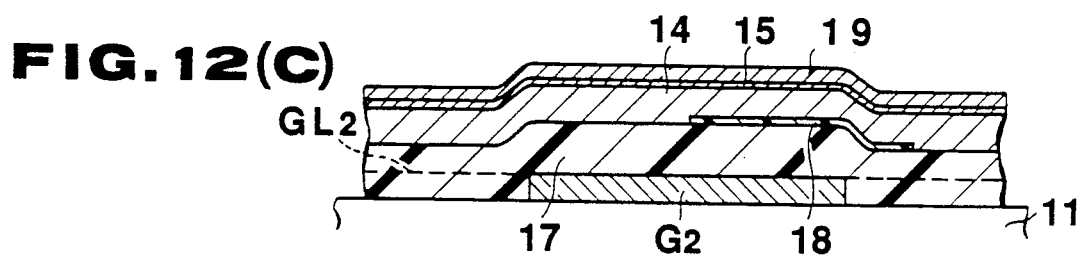

As shown in FIG. 12(B), the memory insulating film 18 is etched except for a portion corresponding to the memory transistor T3 by etching. As shown in FIG. 12(C), the i-type semiconductor layer 14 consisting of amorphous silicon or polysilicon, the n-type semiconductor layer 15 obtained by doping amorphous silicon or polysilicon with an n-type impurity, and a metal film 19 consisting of chromium or the like, which is formed into the source and drain electrodes S2 and D2, are sequentially deposited on the resultant structure throughout the upper surface of the substrate 11

Figure 12D:
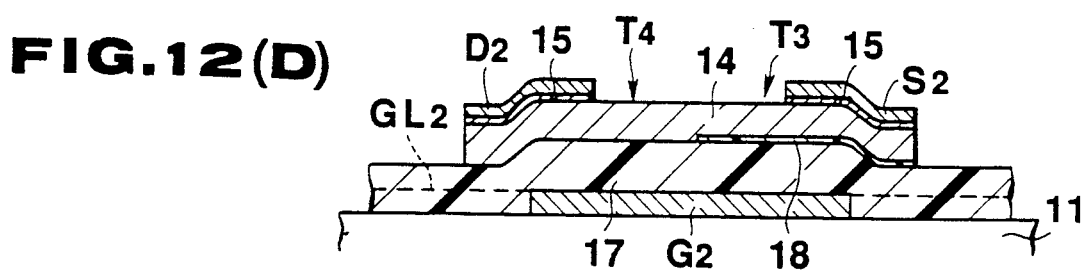

Subsequently, as shown in FIG. 12(D), the metal film 19 and the n-type semiconductor layer 15 are patterned to form the source electrode S2, a source line, the drain electrode D2, and a drain line. The i-type semiconductor layer 14 is patterned to form a memory element region. Thereafter, a protective insulating film 16 is formed on the resultant structure. With this process, the thin film transistor memory shown in FIG. 11 is completed.

In this embodiment, the areas of the gate electrodes of the memory and selection transistors T3 and T4 are also determined by the selected characteristics of the respective transistors T3 and T4. With this selection, the area of the memory insulating film 18 is determined.

In this memory element M3, data write, erase, and read operations are performed by applying voltage of predetermined levels to the gate electrode G2. Therefore, the threshold voltage of the memory transistor T3 may be changed by repetitive data read operations, and hence a stable read operation may not be performed.

Similar to the first embodiment, therefore, in this embodiment, a read gate electrode is arranged in addition to the gate electrode G2 so that data can be read out by applying a voltage of a predetermined level to the read gate electrode in a read mode.

Figure 13:
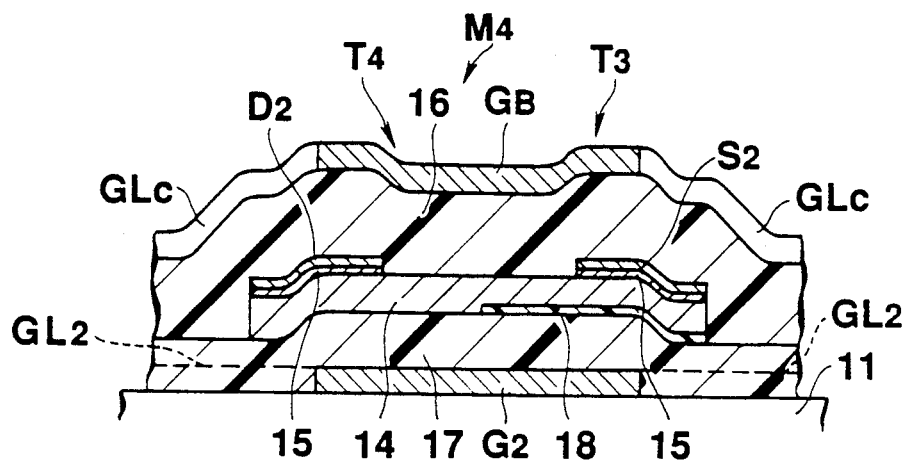
FIG. 13 is sectional view of a memory element obtained by forming a read gate electrode on the memory element of the second embodiment.

FIG. 13 is a sectional view of a memory element M4 including a read gate electrode. FIGS. 14(A) to 14(E) show the steps in manufacturing the memory element M4.

The same reference numerals in FIGS. 13 and 14(A) to 14E denote the same parts as in FIGS. 11 and 12(A) to 12D showing the memory element M3, and a description thereof will be omitted.

In the memory element M4, a lower gate insulating film of a memory transistor T3 is constituted by a double layer consisting of a non-memory insulating film 17 and a memory insulating film 18, and a lower gate insulating film of a selection transistor T4 is constituted by only the non-memory insulating film 17. The non-memory insulating film 17 consists of silicon nitride (SiN) whose composition ratio Si/N is set to be almost equal to the stoichiometric ratio (Si/N=0.75) so as not to have a charge accumulating function. The memory insulating film 18 consists of silicon nitride whose composition ratio Si/N is set to be larger than the stoichiometric ratio (Si/N=0.85 to 1.15) so as to have a charge accumulating function. The non-memory insulating film 17 covers the entire region of a write/erase gate electrode G2 commonly used for the memory and selection thin film transistors T3 and T4. The memory insulating film 18 is formed on the non-memory insulating film 17 so as to correspond to a portion of the write/erase gate electrode G2 which corresponds to a gate electrode of the memory transistor T3 (almost a half of the gate electrode G2 in FIG. 13). Note that the non-memory insulating film 17 has a thickness of about 2,000 Å, and the memory insulating film 18 has a very small thickness of about 100 Å.

Similar to the above-described embodiments, the memory element M4 is designed such that the memory and selection transistors T3 and T4 are formed in one thin film transistor. The memory transistor T3 comprises the write/erase gate electrode G2, the lower gate insulating film consisting of the non-memory insulating film 17 and the memory insulating film 18, i- and n-type semiconductor layers 14 and 15, source and drain electrodes S2 and D2, an upper gate insulating film 16, and the read gate electrode GB. The selection transistor T4 comprises the write/erase gate electrode G2, the lower gate insulating film consisting of the non-memory insulating film 17, the i- and n-type semiconductor layers 14 and 15, the source and drain electrodes S2 and D2, the upper gate insulating film 16, and the read gate electrode GB.

FIGS. 14(A) to 14(D) show the steps in manufacturing the memory element M4. The memory element M4 is manufactured in the following steps.

Figure 14A:
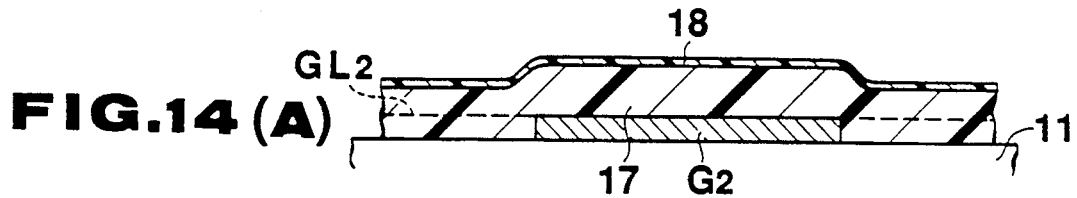
FIGS. 14(A) to 14(E) are sectional views showing the steps in manufacturing the memory element in FIG. 13.

A metal film consisting of chromium or the like is formed on a substrate 11. As shown in FIG. 14(A), the metal film is then patterned to simultaneously form the write/erase gate electrode G3 and a write/erase gate line GL2 connected to the gate electrode G2. The nonmemory insulating film 17 and the memory insulating film 18 constituting the lower gate film are sequentially deposited on the resultant structure throughout the upper surface of the substrate 11.

Figure 14B:
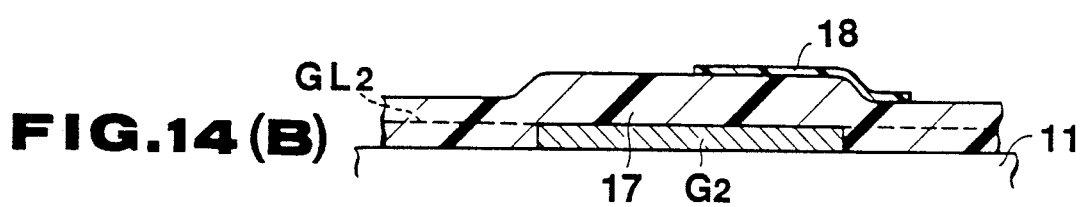
Figure 14C:
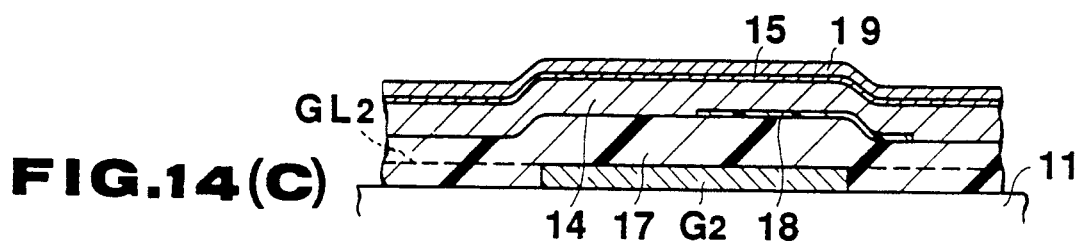

As shown in FIG. 14(B), the memory insulating film 18 except for a portion corresponding to the memory transistor T3 is removed by etching. As shown in FIG. 14(C), the i-type semiconductor layer 14 consisting of amorphous or polysilicon, the n-type semiconductor layer 15 obtained by doping an impurity in amorphous silicon or polysilicon, an a metal film 19 consisting of chromium or the like, which is formed into the source and drain electrodes S2 and D2, are sequentially deposited on the resultant structure throughout the upper surface of the substrate 11.

Figure 14D:
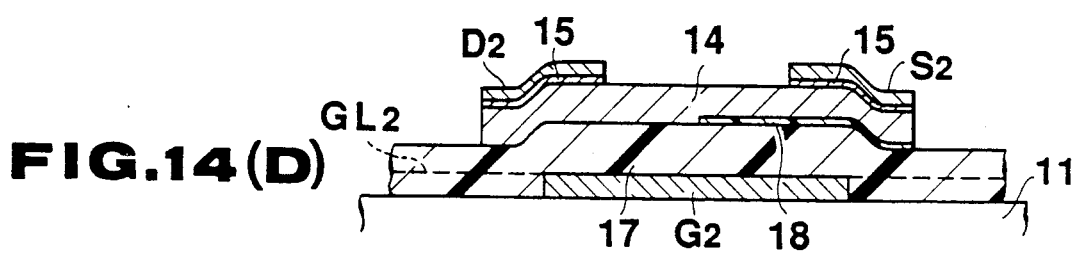

As shown in FIG. 14(D), the metal film 19 and the n-type semiconductor layer 15 are patterned to form the source electrode S2, a source line, the drain electrode D2, and a drain line. The i-type semiconductor layer 14 is then patterned to form a memory element region.

Figure 14E:
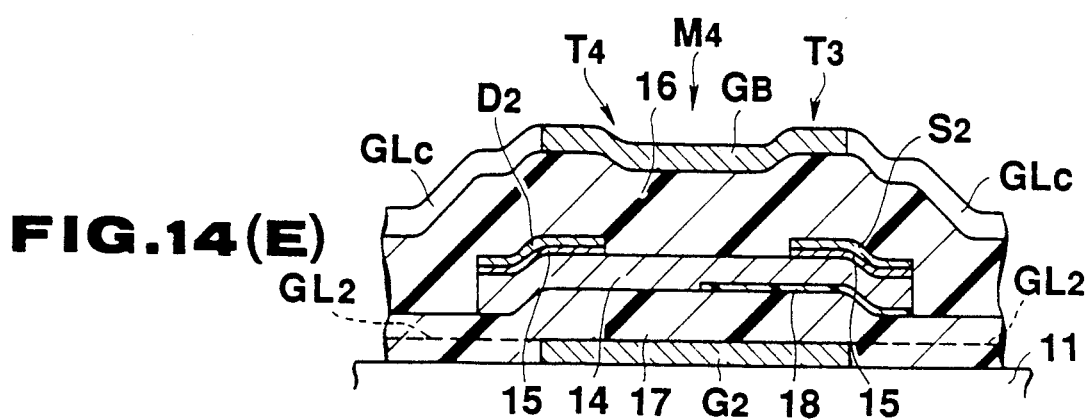

Subsequently, as shown in FIG. 14(E), the upper gate insulating film 16 and a metal film consisting of chromium or the like are sequentially deposited on the resultant structure. This metal film is patterned to form the read gate electrode GB and a read gate line GLC, thus completing the memory element M4.

In this memory element M4, the areas of the write/erase gate electrodes G2 of the memory and selection transistors T3 and T4 are also determined in accordance with the selection of the characteristics of the respective transistors T3 and T4. With this selection, the area of the memory insulating film 18 is determined.

Since operations of matrix circuits incorporating the memory elements M3 and M4 are the same as those of the matrix circuits incorporating the memory elements M1 and M2, a description thereof will be omitted.

Third Embodiment

The third embodiment of the present invention will be described below.

Figure 15:
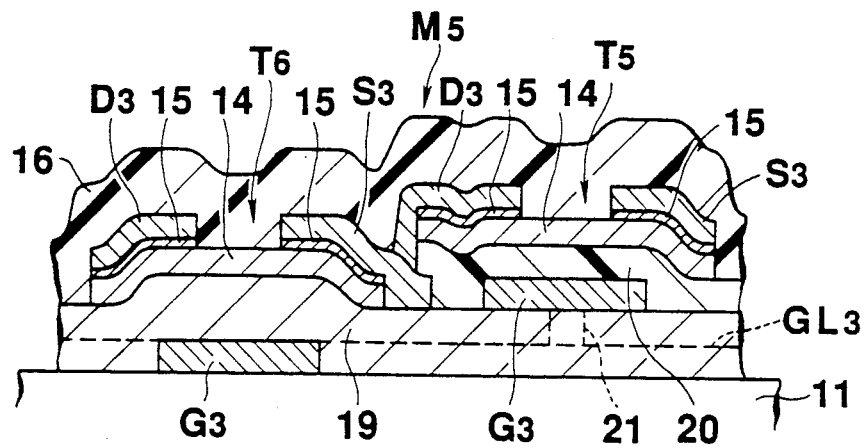
FIG. 15 is a sectional view of a memory element according to the third embodiment of the present invention.

FIG. 15 shows the third embodiment of the present invention. The same reference numerals in the third embodiment denote the same parts as in the first and second embodiments, and a description thereof will be omitted.

In a memory element M5 of this embodiment, memory and selection transistors T5 and T6 are constituted by different thin film transistors.

The selection transistor T6 comprises a gate electrode G3 formed on an insulating substrate 11, a selection transistor gate insulating film 19 formed on the resultant structure throughout the upper surface of the substrate 11, an i-type semiconductor layer 14 formed on the gate insulating film 19, and source and drain electrodes S3 and D3 formed on the resultant structure through an n-type semiconductor layer 15. The memory transistor T5 comprises a gate electrode G3 formed on the selection transistor gate insulating film 19, a memory transistor gate insulating film 20 formed on the resultant structure, an i-type semiconductor layer 14 formed on the gate insulating film 20, and source and drain electrodes S3 and D3 formed on the resultant structure through an n-type semiconductor layer 15. Each of the memory transistor gate insulating film 20 and the selection transistor gate insulating film 19 consists of silicon nitride having a composition ratio Si/N which is almost equal to the stoichiometric ratio (Si/N=0.75). The memory transistor gate insulating film 20 is formed to have a small thickness of about 500 Å to 1,500 Å so as to have a charge accumulating function. The selection transistor gate insulating film 19 is formed to have a large thickness of about 2,500 Å to 3,500 Å so as not to have a charge accumulating function. Referring to FIG. 15, reference symbol GL3 denotes a gate line which is formed on the substrate 11 to be integral with the gate electrode G3 of the selection transistor T6. The gate electrode G3 of the memory transistor T10 is connected to the gate line GL3 through a contact hole 21 formed in the selection transistor gate insulating film 19. The drain electrode D3 of the memory transistor T5 is connected to the source electrode S3 of the selection transistor T6. The source electrode S3 of the memory transistor T5 and the drain electrode D3 of the selection transistor T6 are respectively connected to source and drain lines (not shown) integrally formed with the source and drain electrodes S3 and D3. Reference numeral 16 denotes a protective insulating film.

Note that in this embodiment, the memory transistor gate insulating film 20 may consist of silicon nitride whose composition ratio Si/N is set to be larger than the stoichiometric ratio (Si/N=0.85 to 1.15) so as to have a charge accumulating function.

In this memory element M5, a read gate electrode is also arranged, and a data read operation is performed by applying a voltage of a predetermined level to the read gate electrode, thus enabling a stable read operation.

Figure 16:
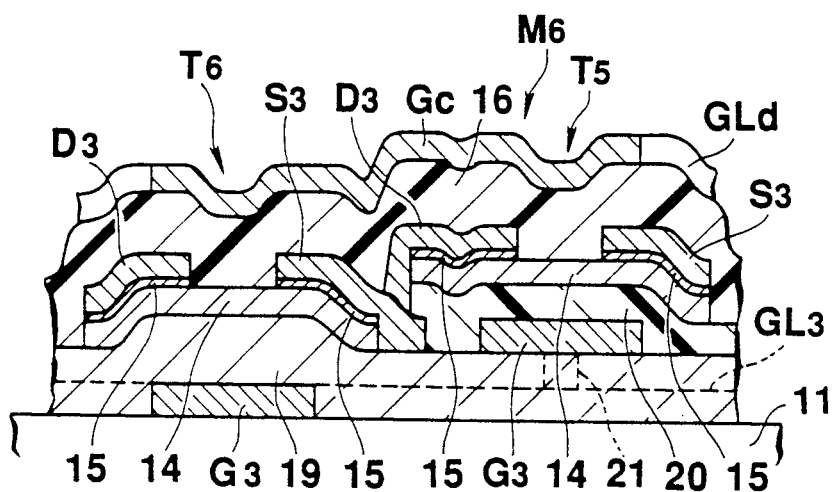
FIG. 16 is a sectional view of a memory element obtained by forming a read gate electrode on the memory element in FIG. 15.

FIG. 16 shows a memory element M6 obtained by forming a read gate electrode on the memory element M5. The same reference numerals in FIG. 16 denote the same parts as in FIG. 15 showing the memory element M5.

In the memory element M6, memory and selection transistors T5 and T6 are constituted by different thin film transistors. The selection transistor T6 comprises a write/erase gate electrode G3 formed on an insulating substrate 11, a selection transistor lower gate insulating film 19 formed on the resultant structure throughout the upper surface of the substrate 11, an i-type semiconductor layer 14 formed on the lower gate insulating film 19, source and drain electrodes S3 and D3 formed on the resultant structure through an n-type semiconductor layer 15, an upper gate insulating film 16 formed on the resultant structure throughout the upper surface of the substrate 11, and a read gate electrode GC formed o the upper gate insulating film 16. The memory transistor T5 comprises a write/erase gate electrode G3 formed on the selection transistor lower gate insulating film 19, a memory transistor lower gate insulating film 20 formed on the resultant structure, an i-type semiconductor layer 14 formed on the lower gate insulating film 20, source and drain electrodes S3 and D3 formed on the resultant structure through an n-type semiconductor layer 15, the upper gate insulating film 16, and the read gate electrode GC. The read gate electrode GC is formed into an integral electrode commonly used for the memory and selection transistors T5 and T6. Each of the memory and selection transistor lower gate insulating films 20 and 19 consists of silicon nitride having a composition ratio Si/N almost equal to the stoichiometric ratio (Si/N=0.75). The memory transistor gate insulating film 20 is formed to have a small thickness of about 500 Å to 1,500 Å so as to have a charge accumulating function. The selection transistor gate insulating film 19 is formed to have a large thickness of about 2,500 Å to 3,500 Å so as not to have a charge accumulating function. The upper gate insulating film 16 consists of silicon nitride having a composition ratio Si/N almost equal to the stoichiometric ratio and a thickness of about 500 Å to 1,500 Å. Referring to FIG. 16, reference symbol SL3 denotes a write/erase gate line which is formed on the substrate 11 to be integral with the gate electrode G3 of the selection transistor T6. The gate electrode G3 of the memory transistor T5 is connected to the write/erase gate line GL3 through a contact hole 21 formed in the selection transistor gate insulating film 19. The drain electrode D3 of the memory transistor T5 is connected to the source electrode S3 of the selection transistor T6. The source electrode S3 of the memory transistor T5 and the drain electrode D3 of the selection transistor T6 are respectively connected to source and drain lines (not shown) integrally formed with the source and drain electrodes S3 and D3. The read gate electrode GC extends to a read gate line GLd formed on the upper gate insulating film 16.

In this embodiment, the memory transistor gate insulating film 21 may consist of silicon nitride whose composition ratio Si/N is set to be larger than the stoichiometric ratio (Si/N=0.85 to 1.15) so as to have a charge accumulating function.

Since operations of matrix circuits incorporating the memory elements M5 and M6 are the same as those of the matrix circuit in the first embodiment, a description thereof will be omitted.

Fourth Embodiment

Figure 17:
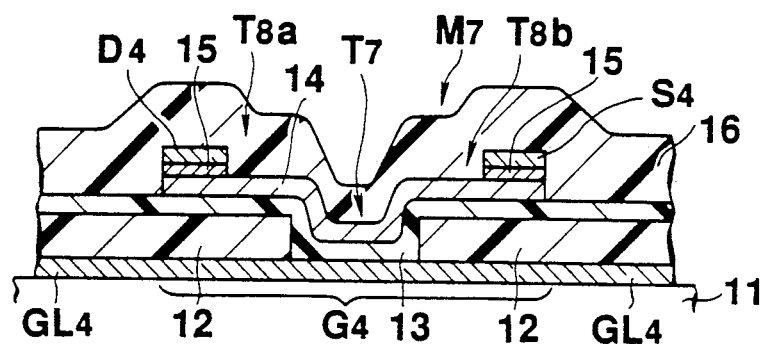
FIG. 17 is a sectional view of a memory element according to the fourth embodiment of the present invention.
Figure 18:
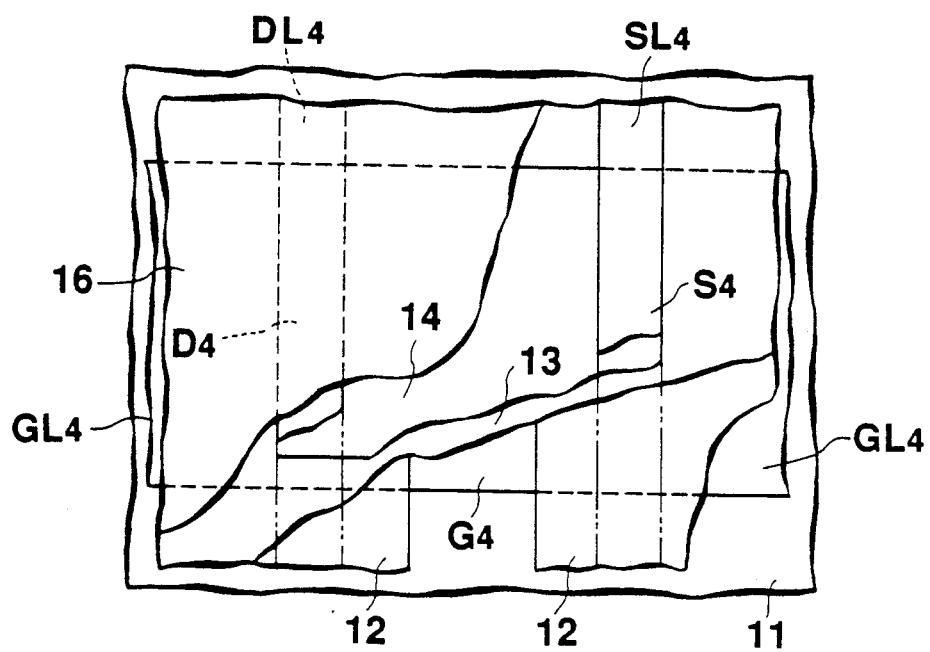
FIG. 18 is a plan view of the memory element in FIG. 17.

FIG. 17 is a sectional view of a memory element M7 according to the fourth embodiment of the present invention. FIG. 18 is a plan view of the memory element M7.

A structure of the memory element M7 will be described below. Referring to FIGS. 17 and 18 reference numeral 11 denotes an insulating substrate consisting of glass or the like. A gate electrode G4 and a gate line GL4 connected thereto are formed on the substrate 11. The gate electrode G4 is commonly used for memory and selection thin film transistors T7, T8a, and T8b. The gate line GL4 is connected to the gate electrode G4. A first gate insulating film 12 is formed on the substrate 11 so as to cover both side portions of the gate electrode G4, excluding its middle portion, i.e., gate electrode portions of the selection transistors T8a and T8b. A second gate insulating film 13 is formed on the resultant structure so as to cover the entire gate electrode G4. Each of the gate insulating films 12 and 13 consists of silicon nitride (SiN) having a composition ratio Si/N of silicon atoms to nitrogen atoms N which is almost equal to the stoichiometric ratio (Si/N=0.75). The first gate insulating film 12 has a large thickness of about 2,500 Å to 3500 Å, and the second gate insulating film 13 has a small thickness of about 500 Å to 1,500 Å. That is, the gate insulating film on the gate electrode G4 is designed such that the first and second gate insulating films 12 and 13 are formed on both the side portions of the gate electrode G4 corresponding to the selection transistors T8a and T8b so as to constitute a double layer, whereas only the second gate insulating film 13 is formed on the middle portion corresponding to the memory transistor T7 so as to form a thin film. Since the second gate insulating film 13 of this memory transistor T7 portion is thin, it has a charge accumulating function even though it has a composition ratio Si/N almost equal to the stoichiometric ratio. Note that the gate insulating films 12 and 13 corresponding to the selection transistors T8a and T8b are thick as a whole, they have no charge accumulating function. In addition, an i-type semiconductor layer 14, which is commonly used for the memory transistor T7 and the selection transistors T8a and T8b, is formed on the second gate insulating film 13 so as to correspond to the entire region of the gate electrode G4. The i-type semiconductor layer 14 consists of amorphous silicon or polysilicon. Source and drain electrodes S4 and D4 are formed on both side portions of the i-type semiconductor layer 14 through an n-type semiconductor layer 15 obtained by amorphous silicon or polysilicon doped with an n-type impurity. The source electrode S4 is connected to a source line SL4 integrated therewith. The drain electrode D4 is connected to a drain line DL4 integrated therewith. Note that reference numeral 16 denotes a protective insulating film covering the memory element M7.

That is, the memory element M7 is designed such that the memory transistor T7 and the two selection transistors T8a and T8b paired therewith are formed in one thin film transistor. The memory transistor T7 comprises the gate electrode G4, the second gate insulating film 13, the i- and n-type semiconductor layers 14 and 15, and the source and drain electrodes S4 and D4. Each of the selection transistors T8a and T8b comprises the gate electrode G4, the first and second lower gate insulating films 12 and 13, the i- and n-type semiconductor layers 14 and 15, and the source and drain electrodes S4 and D4.

FIGS. 19(A) to 19(D) show a method of manufacturing the memory element M7. The memory element M7 is manufactured in the following steps.

Figure 19A:
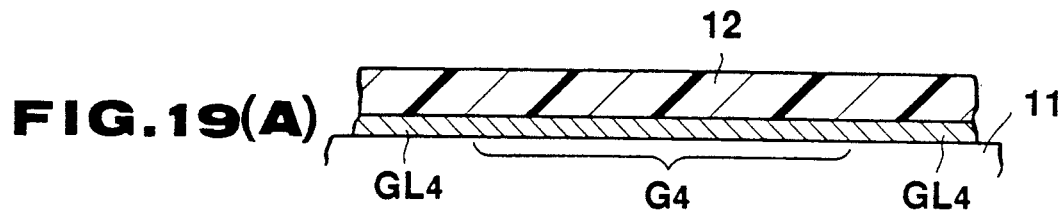
FIGS. 19(A) to 19(D) are sectional views showing the steps in manufacturing the memory element in FIG. 17.

A metal film consisting of chromium or the like is formed on a substrate 11. As shown in FIG. 19(A), the metal film is then patterned to simultaneously form the gate electrode G4 and the gate line GL connected thereto. The first gate insulating film 12 is deposited on the resultant structure throughout the upper surface of the substrate 11.

Figure 19B:
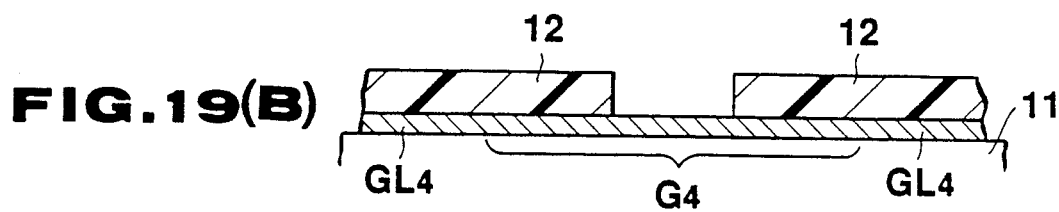

As shown in FIG. 19(B), a portion of the first gate insulating film 12 which corresponds to substantially the middle portion of the gate electrode G4 is removed by etching to expose a portion of the gate electrode G4 which corresponds to the memory transistor T7.

Figure 19C:
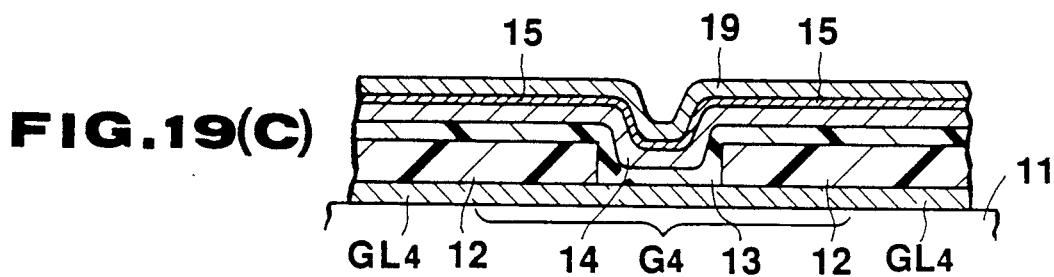

As shown in FIG. 19(C), the second gate insulating film 13 is deposited on the resultant structure throughout the upper surface of the substrate 11. The i- and n-type semiconductor layers 14 and 15, and a metal film 19 consisting of chromium, which is be formed into the source and drain electrodes S4 and D4, are sequentially deposited on the resultant structure.

Figure 19D:
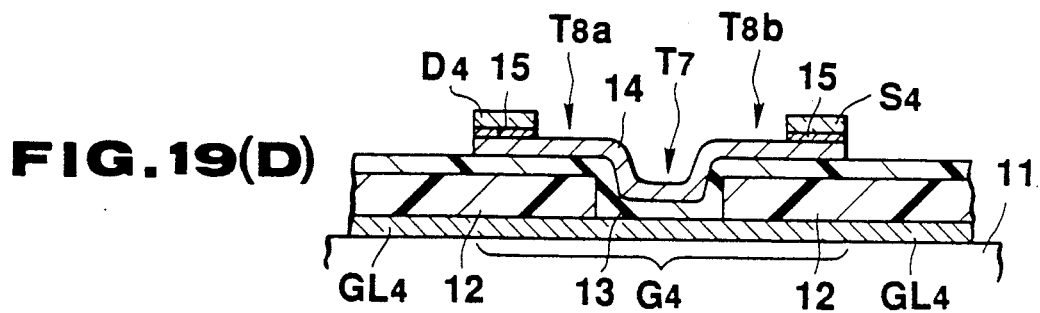

Subsequently, as shown in FIG. 19(D), the metal film 19 and the n-type semiconductor layer 15 are patterned to form the source electrode S4, the source line SL4, the drain electrode D4, and the drain line DL4. The i-type semiconductor layer 14 is then patterned to form a memory element region. The protective insulating film 16 is formed on the resultant structure. With this process, the thin film transistor memory shown in FIGS. 17 and 18 is completed.

As described above, in this memory element M7, the selection transistors T8a and T8b are arranged on both the sides of the memory transistor T7 in series. With this arrangement, even if characteristics of one of the of the selection transistors T8a and T8b are defective, the other selection transistor can select and guard the memory transistor T7. Therefore, the reliability of the memory can be improved.

In addition, in the thin film transistor memory of this embodiment, the gate electrodes G4 of the memory transistor T7 and the selection transistors T8a and T8b are connected to the common gate line GL4 so that application of signals to the gate electrodes G4 of the memory transistor T7 and the selection transistors T8a and T8b can be performed through the common gate line GL4. Therefore, the number of gate lines can be reduced to ½ that of a conventional thin film transistor memory. Since the area required for wiring of gate lines can be reduced by the corresponding amount, the packing density can be increased without increasing the area of the overall memory. Furthermore, since the memory element M7 is designed such that the memory transistor T7 and the selection transistors T8a and T8b are formed in one thin film transistor, the element area of each memory element M7 can be greatly reduced. This further increases the packing density.

Fifth Embodiment

Figure 20:
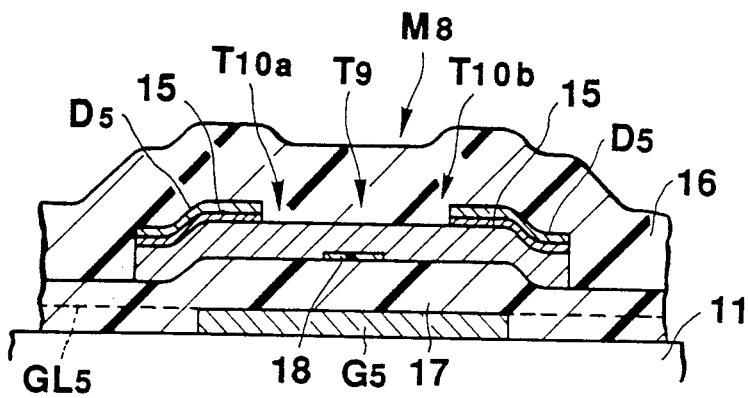
FIG. 20 is a sectional view of a memory element according to the fifth embodiment of the present invention.

The fifth embodiment of the present invention will be described below. FIGS. 20 and 21(A) to 21(D) show the fifth embodiment of the present invention. FIG. 20 is a sectional view of a memory element M8. The same reference numerals in FIGS. 20 and 21(A) to 21(D) denote the same parts as in FIGS. 18 and 19(A) to 19(D) showing the fourth embodiment, and a description thereof will be omitted.

As shown in FIG. 20, in the memory element M8 of this embodiment, a gate insulating film of a memory transistor T9 is constituted by a double layer consisting of a non-memory insulating film 17 and a memory insulating film 18, and a gate insulating film of each of selection transistors T10a and T10b is constituted by only the non-memory insulating film 17. The non-memory insulating film 17 consists of silicon nitride (SiN) whose composition ratio Si/N is set to be almost equal to the stoichiometric ratio (Si/N=0.75) so as not to have a charge accumulating function. The memory insulating film 18 consists of silicon nitride whose composition ratio Si/N is set to be larger than the stoichiometric ratio (Si/N=0.85 to 1.15) so as to have a charge accumulating function. The non-memory insulating film 17 covers the entire region of a gate electrode G5 commonly used for the memory and selection thin film transistors T9, T10a, and T10b. The memory insulating film 18 is formed on the non-memory insulating film 17 so as to correspond to a portion of the gate electrode G5 which corresponds to a gate electrode of the memory transistor T9 (a middle portion of the gate electrode G5). Note that the non-memory insulating film 17 has a thickness of about 2,000 Å, and the memory insulating film 18 has a very small thickness of about 100 Å.

The memory element M8 is designed such that the memory transistor T9 and the two selection transistors T10a and T10b are formed in one thin film transistor. More specifically, the memory transistor T9 comprises the gate electrode G5, the gate insulating film consisting of the non-memory and memory insulating films 17 and 18, i- and n-type semiconductor layers 14 and 15, and source and drain electrodes S5 and D5. Each of the selection transistors T10a and T10b comprises the gate electrode G5, the gate insulating film consisting of the non-memory insulating film 17, the i- and n-type semiconductor layers 14 and 15, and the source and drain electrodes S5 and D5.

FIGS. 21(A) to 21(D) show a method of manufacturing the memory element M8. The memory element M8 is manufactured in the following steps.

Figure 21A:
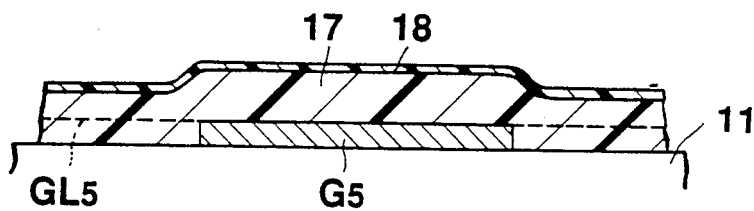
FIGS. 21(A) to 21(D) are sectional views showing the steps in manufacturing the memory element in FIG. 20.

A metal film consisting of chromium or the like is formed on a substrate 11. As shown in FIG. 21(A), the metal film is patterned to simultaneously form the gate electrode G5 and a gate line GL5 connected thereto. The non-memory and memory insulating films 17 and 18 are sequentially deposited on the resultant structure throughout the upper surface of the substrate 11.

Figure 21B:
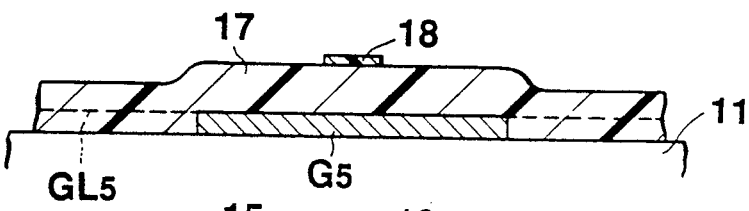
Figure 21C:
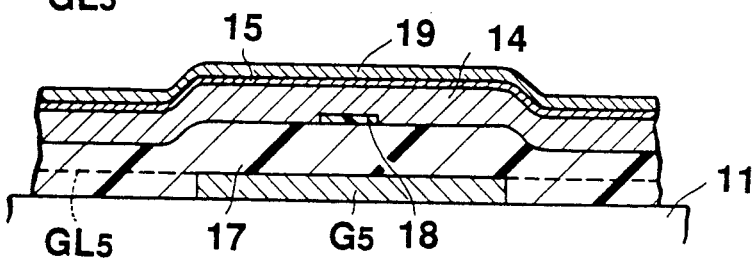

As shown in FIG. 21B, the memory insulating film 18 except for a portion corresponding to the memory transistor T9 is removed by etching. As shown in FIG. 21(C), the i- and n-type semiconductor layers 14 and 15, and a metal film 19 consisting of chromium, which is to be formed into the source and drain electrodes S5 and D5, are sequentially deposited on the resultant structure throughout the upper surface of the substrate 11.

Figure 21D:
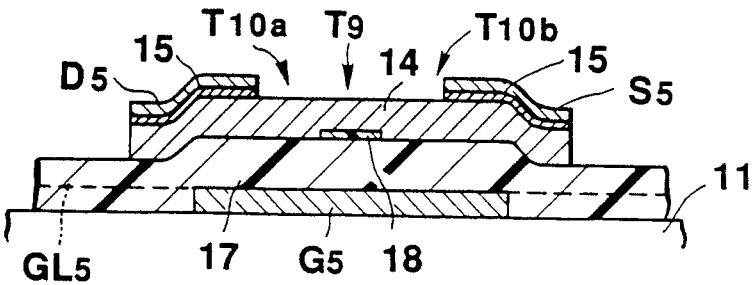

As shown in FIG. 21(D), the metal film 19 and the n-type semiconductor layer 15 are patterned to form the source electrode S5, a source line, the drain electrode D5, and a drain line. The i-type semiconductor layer 14 is then patterned to form a memory element region. Thereafter, a protective insulating film 16 is formed on the resultant structure. With this process, the thin film transistor memory shown in FIG. 20 is completed.

Similarly, this memory element M8 is designed such that the selection transistors T10a and T10b are formed on both the sides of the memory transistor T9 in series. With this arrangement, even if characteristics of one of the pair of the selection transistors T10a and T10b are defective, the other selection transistor can select and guard the memory transistor T9. Therefore, the reliability of the memory can be improved. In this embodiment, since the gate electrodes G5 of the memory transistor T9 and the selection transistors T10a and T10b are also connected to the common gate line GL5, the number of gate lines can be reduced to ½ that of the conventional thin film transistor memory. Therefore, the packing density can be increased without increasing the area of the overall memory. In addition, since memory element M8 is designed such that the memory transistor T9 and the two selection transistors T10a and T10b are formed in one thin film transistor, the element area of each memory element M8 can be reduced. This further increases the packing density.

Operations of matrix circuits respectively incorporating the memory elements of the fourth and fifth embodiments will be described below.

Figure 22A:
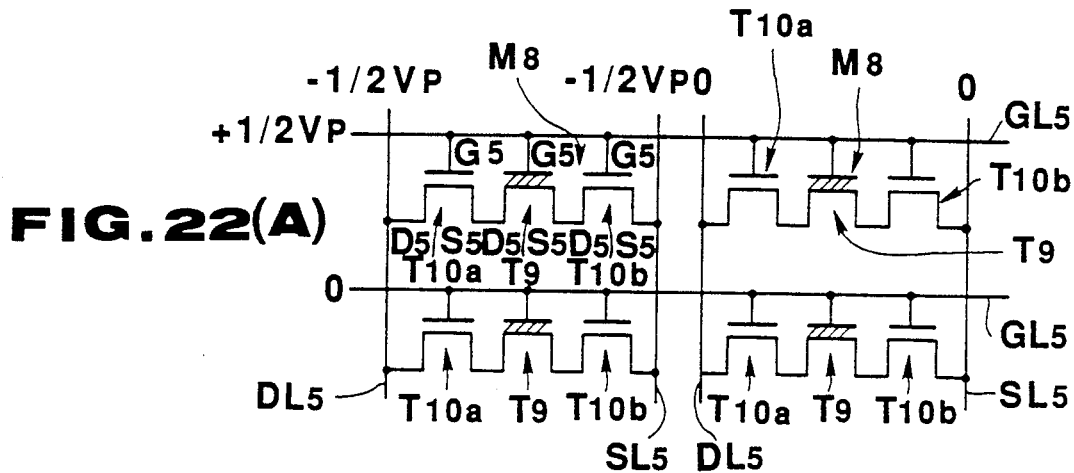
FIGS. 22(A) to 22(C) are circuit diagrams showing a matrix circuit of memory elements each of which is identical to the memory element in FIG. 20.
Figure 22B:
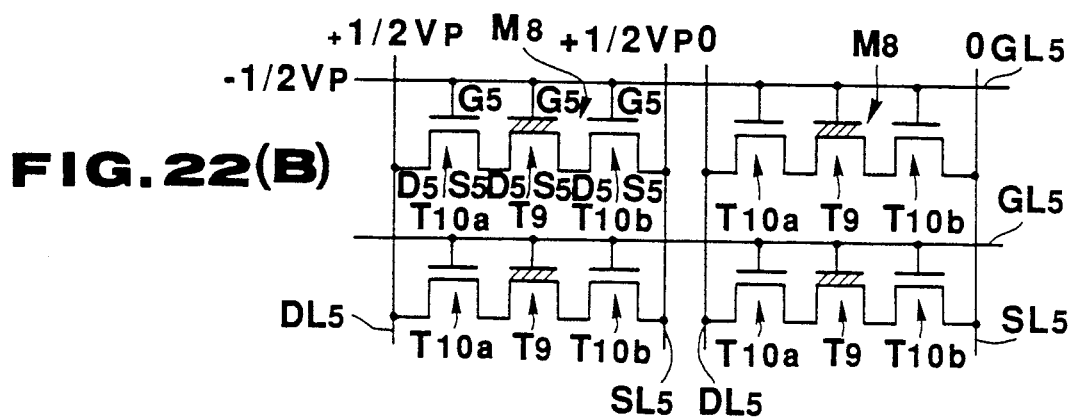
Figure 22C:
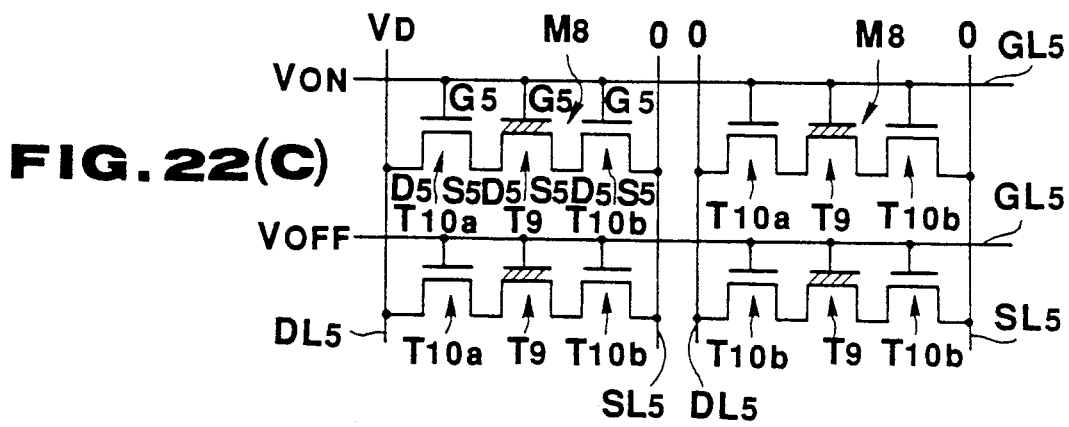

FIGS. 22(A) to 22(C) show a circuit in which the memory elements M8 are incorporated in the form of a 2×2 matrix.

Referring to FIGS. 22(A) to 22(C), reference symbol T9 denotes the memory transistor; and T10a and T10b, the selection transistors which are arranged in pairs in accordance with the corresponding memory transistor T9. Each pair of the selection transistors T10a and T10b are arranged on both the sides of the corresponding memory transistor T9. One selection transistor T10a of the pair of the selection transistors T10a and T10b has the source electrode S5 integrated with the drain electrode D5 of the memory transistor T9 so as to be connected in series therewith. The other selection transistor T10b has the drain electrode D5 integrated with the source electrode S5 of the memory transistor T9 so as to be connected in series therewith. One memory element M8 is constituted by one pair of the selection transistors T10a and T10b and the memory transistor T9 arranged therebetween. Reference symbol GL5 denotes the gate line (address line); and SL5 and DL5, the source and drain lines (data lines), respectively. The gate lines GL5 and the source and drain lines SL5 and DL5 are arranged perpendicular to each other in the form of a matrix. The memory elements M8 are respectively arranged at intersections defined by the gate lines GL5 and the source and drain lines SL5 and DL5. The gate electrodes G5 of each memory transistor T9 and the corresponding two selection transistors T10a and T10b are connected to the corresponding common gate line GL5. In each memory element M8, the drain electrode D5 of one selection transistor T10a is connected to the drain line DL5, and the source electrode S5 of the other selection transistor T10b is connected to the source line SL5.

Write, erase, and read operations of the memory elements M8 are performed in the following manner.

FIGS. 22(A) to 22(C) respectively show voltage application states in write, erase, and read modes. Note that each of FIGS. 22A to 22C shows a state wherein the upper left memory element M8 in the drawing is to be selected.

A write operation will be described first. In the write mode, as shown in FIG. 22(A), a positive voltage $+\frac{1}{2} V_P$ (+20 V) corresponding to $\frac{1}{2}$ a write/erase voltage $V_P$ (e.g., 40 V) of the memory transistor T9 is applied to the gate line GL5 to be selected. At the same time, a negative voltage $-\frac{1}{2} V_P$ (−20 V) corresponding to $\frac{1}{2}$ the write/erase voltage $V_P$ is applied to each of the source and drain lines SL5 and DL5. The potentials of the non-selected gain line GL5 and the non-selected source and drain lines SL5 and DL5 are set to be 0. Upon application of such voltage signals, the selection transistors T10a and T10b of the selected memory element M8 at the intersection defined by the selected gate line GL5 and the selected source and drain lines SL5 and DL5 is turned on by the voltage application to the gate electrode G5. As a result, a potential difference corresponding to the write/erase voltage $V_P$ is generated between the gate electrode G5 and the source and drain electrodes S5 and D5 of the memory transistor T9, and the memory transistor T9 is set in a write enable state. In another non-selected memory element M8 on the selected gate line GL5, only a potential difference of $\frac{1}{2} V_P$ is present between the gate electrode G5 and the source and drain electrodes S5 and D5 of each of the memory and selection transistors T9, T10a, and T10b. Therefore, this memory transistor T9 is set in a write disable state. With regard to other memory elements on the non-selected gate line GL5, the lower left memory element in FIG. 22(A) has only a potential difference of $\frac{1}{2} V_P$ generated between the gate and the source and drain electrodes of the memory transistor T9. Hence, this memory transistor T9 is in a write disable state. In the lower right memory element in FIG. 22(A), similar to the above-mentioned non-selected memory element M8, the potential difference between the gate and the source and drain of the memory transistor T9 is 0 (no voltage application). That is, a gate-source voltage is equal to a gate-drain voltage. Therefore, this memory transistor T9 is also in a write disable state.

In the erase mode, as shown in FIG. 22(B), a voltage $-\frac{1}{2} V_P$ is applied to the gate line GL5 to be selected. At the same time, a voltage $+\frac{1}{2} V_P$ is applied to each of the source and drain lines SL5 and DL5 to be selected. Note that the same voltage signals as in the write mode are applied to the non-selected gate line GL5 and the non-selected source and drain lines SL5 and DL5. Upon application of such voltage signals, a potential difference corresponding to the write/erase voltage $V_P$ and having a polarity opposite to it is generated between the gate electrode G5 and the source and drain electrodes S5 and D5 of the memory transistor T9 of the selected memory element M8. At this time, similar to the memory transistor T9, a voltage $-V_P$ is applied between the gate electrode and the source and drain electrodes S5 and D5 of each of the selection transistors T10a and T10b on both the sides of the memory transistor T9. In a thin film transistor having a semiconductor layer consisting of amorphous silicon or polysilicon, even if a high negative voltage is applied to the gate electrode, the source-drain path is normally rendered conductive. That is, the thin film transistor is turned on. Therefore, the selection transistors T10a and T10b are turned on by the high negative voltage $-V_P$, and data held in the memory transistor T9 is erased. Similarly, in this case, the potential difference between the gate electrode G5 and the source and drain electrodes S5 and D5 of the memory transistor T9 of the non-selected memory element M8 is $\frac{1}{2} V_P$, and hence the memory transistor T9 is in an erase disable state.

In the read mode, as shown in FIG. 22(C), a voltage $V_{ON}$ is applied to the gate line GL5 to be selected. At the same time, a voltage $V_D$ is applied to the drain line DL5 to be selected, and the potential of the source line SL5 to be selected is set to 0. Note that the voltages $V_{ON}$ and $V_D$ are sufficiently lower than the write/erase voltage $V_P$ (40 V) of the memory transistor T9 and are set as, e.g., $V_{ON}=10$ V and $V_D=10$ V. In addition, a voltage $V_{OFF}$ (0 V) is applied to the non-selected gate line GL5, and the potentials of the non-selected source and drain lines SL5 and DL5 are set to be 0. Upon application of such voltage signals, a current flows from the drain line DL5 to the source line SL5 in accordance with data held by the memory transistor T9 of the selected memory element M8, and is output as readout data.

In either of the write, erase, and read modes, the voltage applied to the selected source and drain lines SL5 and DL5 is also applied to the non-selected memory element M8 on the source and drain lines SL5 and DL5. However, since the gate potential of each of the selection transistors T10a and T10b of the non-selected memory element M8 is the negative voltage $-\frac{1}{2} V_P$ or $V_{OFF}$ (0 V), the selection transistors T10a and T10b are in an OFF state, and the memory transistor T9 of the non-selected memory element M8 is not influenced by the applied voltage. That is, the selection transistors T10a and T10b serve not only as transistors for selecting the memory transistor T9, but also as guard transistors for guarding the memory transistor T9 from voltages applied in a non-selection operation.

Sixth Embodiment

The sixth embodiment of the present invention will be described below.

Figure 23:
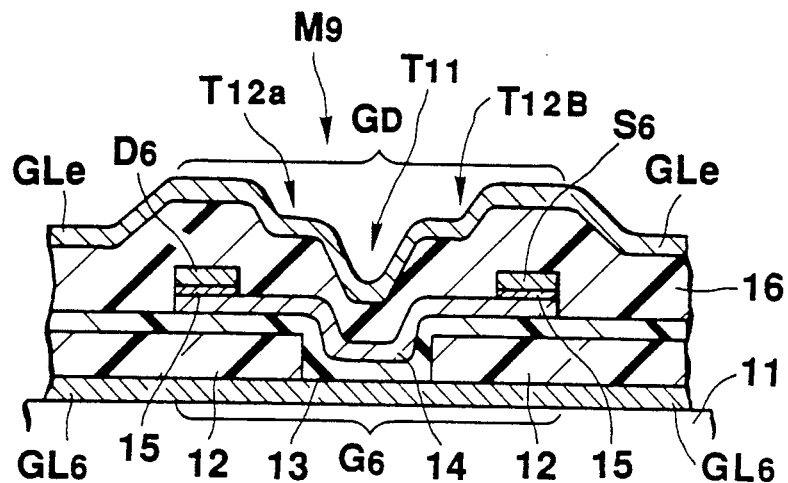
FIG. 23 is a sectional view of a memory element according to the sixth embodiment of the present invention.
Figure 24:
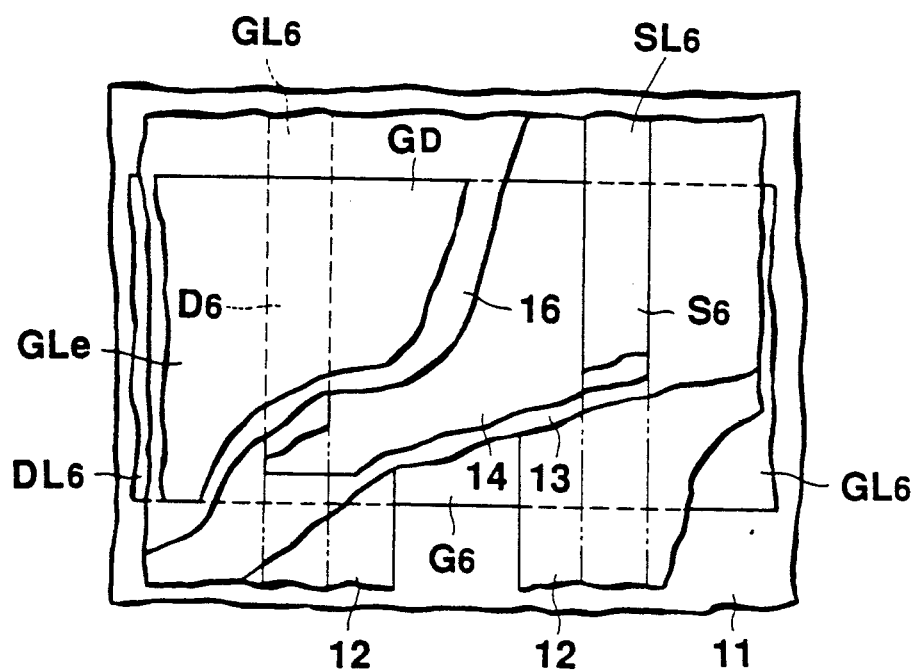
FIG. 24 is a plan view of the memory element in FIG. 23.

FIGS. 23 and 24 show the sixth embodiment of the present invention. FIG. 23 is a sectional view of a memory element M9. FIG. 24 is a plan view of the memory element M9.

The same reference numerals in FIGS. 23 and 24 denote the same parts as in FIGS. 17 and 18 showing the fourth embodiment, and a description thereof will be omitted.

Referring to FIGS. 23 and 24, reference numeral 11 denotes an insulating substrate consisting of glass or the like. A write/erase gate electrode G6 and a write/erase gate line GL6 are formed on the substrate 11. The write/erase gate electrode G6 is commonly used for memory and selection thin film transistors T11, T12a, and T12b. THe write/erase gate line GL6 is connected to the write/erase gate electrode G6. In addition, a lower gate insulating film is formed on the substrate 11. The lower gate insulating film is constituted by a thick film gate insulating film 12 covering both side portions (corresponding to the gate electrodes of the respective selection transistors T12a and T12b) of the write/erase gate electrode G6, excluding its middle portion, and a thin film gate insulating film 13 covering the entire write/erase gate electrode G6. Each of the gate insulating films 12 and 13 consists of silicon nitride (SiN) having a composition ratio Si/N of silicon atoms Si to nitrogen atoms N which is almost equal to the stoichiometric ratio (Si/N=0.75). The thick gate insulating film 12 has a thickness of about 2,500 Å to 3,500 Å, and the thin film gate insulating film has a thickness of about 500 Å to 1,500 Å. More specifically, the lower gate insulating film is designed such that the thin film gate insulating film 13 is stacked on the thick film gate 12 on both the sides of the write/erase gate electrode G6 corresponding to the selection transistors T12a and T12b so as to constitute a double layer, and only the thin film gate insulating film 13 is formed on the middle portion of the write/erase gate electrode G6 corresponding to the memory transistor T11 so as to form a signal layer. Since the lower gate insulating film 13 on this memory transistor T11 portion is thin, it has a charge accumulating function, even though it has the composition ratio Si/N almost equal to the stoichiometric ratio. Note that since the lower gate insulating films 12 and 13 on the portions corresponding to the selection transistors T12a and T12b have a large thickness as a whole, they have no charge accumulating function. An i-type semiconductor layer 14 commonly used for the memory transistor T11 and the selection transistors T12a and T12b is formed on the lower gate insulating film (the thin film gate insulating film 13) so as to correspond to the entire region of the write/erase gate electrode G6. The i-type semiconductor layer 14 consists of amorphous silicon or polysilicon. Source and drain electrodes S6 and D6 are respectively formed on both side portions of the i-type semiconductor layer 14 through an n-type semiconductor layer 15 obtained by amorphous silicon or polysilicon doped with an n-type impurity. The source electrode S6 is connected to a source line SL6 integrated therewith, and the drain electrode D6 is connected to a drain line DL6 integrated therewith. Reference numeral 16 denotes an upper gate insulating film (a silicon nitride film having a composition ratio si/N almost equal to the stoichiometric ratio and a thickness of about 2,500 Å to 3,500 Å) formed on the i-type semiconductor layer 14 and the source drain electrodes S6 and D6 and having no charge accumulating function. A read gate electrode GD and a read gate line GLe are formed on the upper gate insulating film 16. The read gate electrode GD is commonly used for the memory and selection thin film transistors T11, T12a, and T12b. The read gate line GLe is connected to the read gate electrode GD. The read gate line GLe is formed right above the write/erase gate line GL6. The write/erase gate line GL6 and the read gate line GLe are wired along the extension lines of the write/erase gate electrode G6 and the read gate electrode GD. In this embodiment, the write/erase gate line GL6 and the read gate line GLe are formed to have the same widths as those of write/erase and read gate electrodes G6 and GD, respectively.

That is, the memory element M9 is designed such that the memory transistor T11 and the two selection transistors T12a and T12b paired therewith are formed in one thin film transistor. The memory transistor T11 comprises the write/erase gate electrode G6, the lower gate insulating film consisting of only the thin film gate insulating film 13 and having a charge accumulating function, the i- and n-type semiconductor layers 14 and 15, the source and drain electrodes S6 and D6, the upper gate insulating film 16 having no charge accumulating function, and the read gate electrode GD. Each of the selection transistors T12a and T12b comprises the write/erase gate electrode G6, the lower gate insulating film consisting of the double layer of the thick and thin gate insulating films 12 and 13 and having no charge accumulating function, the i- and n-type semiconductor layers 14 and 15, the source and drain electrodes S6 and D6, the upper gate insulating film 16, and the read gate electrode G6.

FIGS. 25(A) to 25(E) show a method of manufacturing the memory element M9. The memory element M9 is manufactured in the following steps.

Figure 25A:
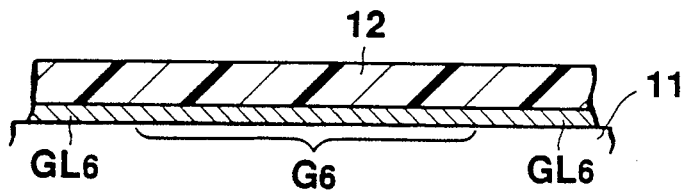
FIGS. 25(A) to 25(E) are sectional views showing the steps in manufacturing the memory element in FIG. 23.

A metal film consisting of chromium or the like is formed on the substrate 11. As shown in FIG. 25(A), the metal film is then patterned to simultaneously form the write/erase gate electrode G6 and the write/erase gate line GL6 connected thereto. The thick gate insulating film 12 as the lower gate insulating film is deposited on the resultant structure throughout the upper surface of the substrate 11.

Figure 25B:
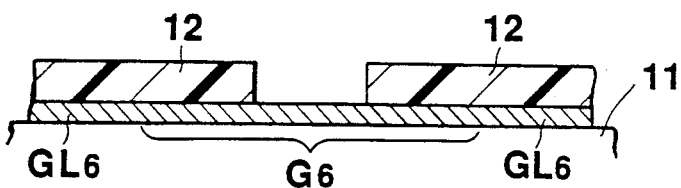

As shown in FIG. 25(B), a portion of the thick gate insulating film 12 which corresponds to a substantially middle portion of the gate electrode G6 is removed by etching so as to expose a portion of the write/erase gate electrode G corresponding to the memory transistor T11.

Figure 25C:
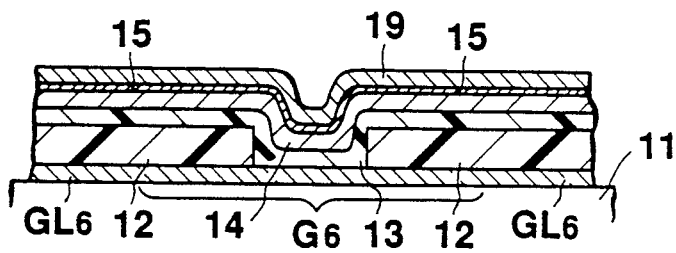

As shown in FIG. 25(C), the thin film gate insulating film 13 as the lower gate insulating film is deposited on the resultant structure throughout the upper surface of the substrate 11. The i- and n-type semiconductor layers 14 and 15 and a metal film 19 consisting of chromium or the like, which is to be formed into the source and drain electrodes S6 and D6, are sequentially deposited on the resultant structure.

Figure 25D:
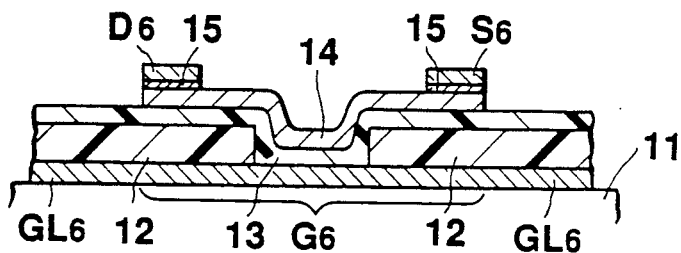

As shown in FIG. 25(D), the metal film 19 and the n-type semiconductor layer 15 are patterned to form the source electrode S6, the source line SL6, the drain electrode D6, and the drain line DL6. The i-type semiconductor layer 14 is then patterned to form a memory element region.

Figure 25E:
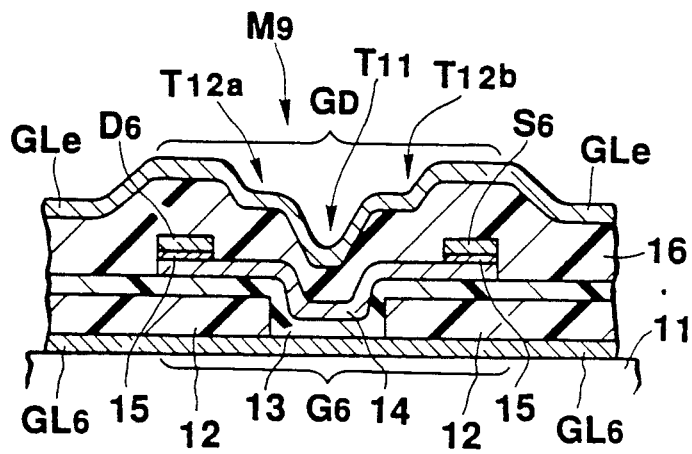

Subsequently, as shown in FIG. 25(E), the upper gate insulating film 16 and a metal film consisting of chromium or the like are sequentially deposited on the resultant structure throughout the upper surface of the substrate 11. The metal film is then patterned to form read gate electrode GD and the read gate line GLe, thus completing the memory element M9 shown in FIGS. 23 and 24.

Since the memory element M9 is designed such that the selection transistors T12a and T12b are formed on both the sides of the memory transistor T11 in series, eve if characteristics of one of the pair of the selection transistors T12a and T12b are defective, the other selection transistor can select and guard the memory transistor T11. This improves the reliability of the memory. In addition, the read gate electrodes G6 are arranged for the memory transistor T11 and the selection transistors T12a and T12b. With this arrangement, write and erase operations are performed by applying a gate voltage to the gate electrodes (write/erase gate electrodes) G6 of the selection transistors T12a and T12b and the memory transistor T11, and a read operation is performed by applying a gate voltage to the read gate electrodes G of the selection transistors T12a and T12b and the memory transistor T11. If a read operation is performed by applying a gate voltage to the read gate electrodes G6 of the selection transistors T12a and T12b and the memory transistor T11, a gate voltage causing a change in threshold voltage of the memory transistor T11 need not be applied to the gate electrode G6 of the memory transistor T11 in the read mode. This prevents changes in threshold voltage of the memory transistor T11 due to repetitive read operations, thus allowing semi-permanent, stable read operations.

Seventh Embodiment

The seventh embodiment of the present invention will be described below.

Figure 26:
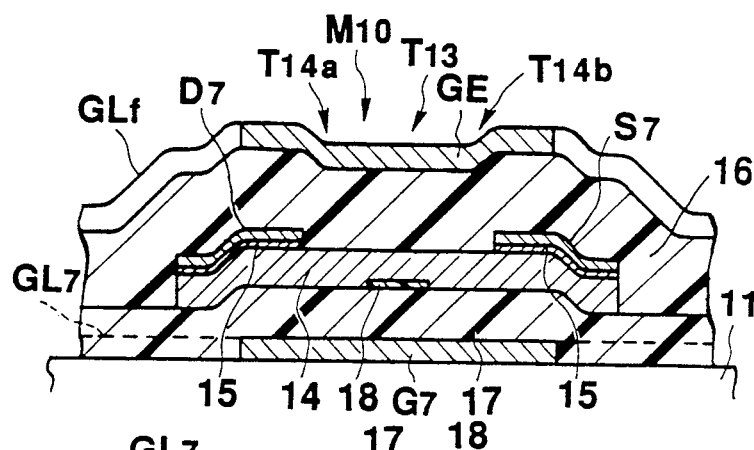
FIG. 26 is a sectional view of a memory element according to the seventh embodiment of the present invention.

FIG. 26 is a sectional view of a memory element M10 according to the seventh embodiment of the present invention.

The same reference numerals in FIG. 26 denote the same parts as in FIG. 20 showing the fifth embodiment, and a description thereof will be omitted.

As shown in FIG. 26, in the memory element M10 of this embodiment, a lower gate insulating film of a memory transistor T13 is formed into a double layer consisting of a non-memory insulating film 17 and a memory insulating film 18, and a lower gate insulating film of each of selection transistors T14a and T14b is constituted by only the non-memory insulating film 17 The non-memory insulating film 17 consists of silicon nitride (SiN) whose composition ratio Si/N is set to be almost equal to the stoichiometric ratio (Si/N=0.75) so as not to have a charge accumulating function. The memory insulating film 18 consists of silicon nitride whose composition ratio Si/N is set to be larger than the stoichiometric ratio (Si/N=0.85 to 1.15) so as to have a charge accumulating function. The non-memory insulating film 17 covers the entire region of a write/erase gate electrode G7 commonly used for the memory and selection thin film transistors T13, T14a, and T14b. The memory insulating film 18 is formed on the non-memory insulating film 17 so as to correspond to a portion of the write/erase gate electrode G7 which corresponds to the gate electrode of the memory transistor T13 (a middle portion of the write/erase gate electrode G7). Note that the non-memory insulating film 17 has a thickness of about 2,000 Å, and the memory insulating film 18 has a very small thickness of about 100 Å.

Similarly, the memory element M10 is designed such that the memory transistor T13 and the two selection transistors T14a and T14b are formed in one thin film transistor. More specifically, the memory transistor T13 comprises the write/erase gate electrode G7, the lower gate insulating film consisting of the non-memory insulating film 17 and the memory insulating film 18. i- and n-type semiconductor layers 14 and 15, drain electrodes S7 and D7, an upper gate insulating film 16, and the read gate electrode G7. Each of the selection transistors T14a and T14b comprises the write/erase gate electrode G7, the lower gate insulating film consisting of the non-memory insulating film 17, the i- and n-type semiconductor layers 14 and 15, the source and drain electrodes S7 and D7, the upper gate insulating film 16, and the read gate electrode G7. In this embodiment, a write/erase gate line GL7 and a read gate line GLf are formed into thin lines, and are arranged to vertically oppose each other and to be wired along one side of an array of memory elements arranged in the gate line direction.

FIGS. 27(A) to 27(E) show a method of manufacturing the memory element M10. The memory element M10 is manufactured in the following steps.

Figure 27A:
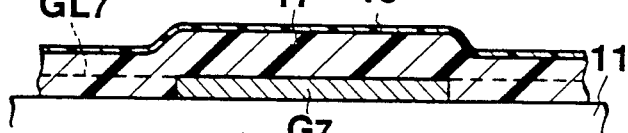
FIGS. 27(A) to 27(E) are sectional views showing the steps in manufacturing the memory element in FIG. 26.

A metal film consisting of chromium or the like is formed on a substrate 11. As shown in FIG. 27(A), the metal film is then patterned to simultaneously form the write/erase gate electrode G7 and the gate electrode G7 connected thereto. The non-memory insulating film 17 and the memory insulating film 18 constituting the lower gate insulating film are sequentially deposited on the resultant structure throughout the upper surface of the substrate 11.

Figure 27B:
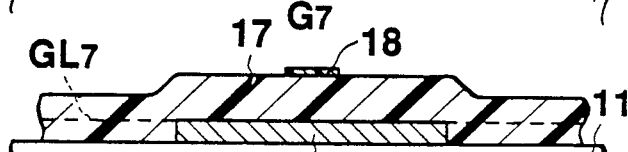
Figure 27C:
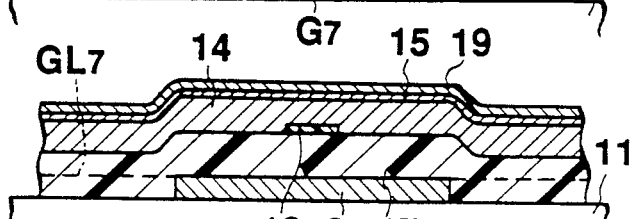

As shown in FIG. 27(B), the memory insulating film 18 except for a portion corresponding to the memory transistor T13 is removed by etching. As shown in FIG. 27(C), the i- and n-type semiconductor layers 14 and 15 and a metal film consisting of chromium or the like, which is to be formed into the source and drain electrodes S7 and D7, are sequentially deposited on the resultant structure throughout the upper surface of the substrate 11.

Figure 27D:
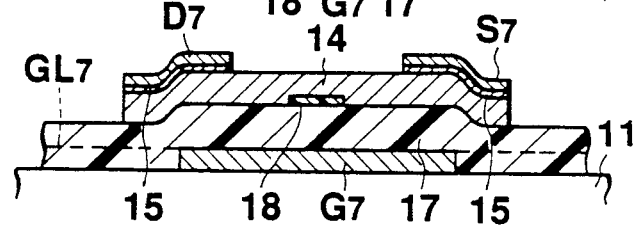

As shown in FIG. 27(D), the metal film 19 and the n-type semiconductor layer 15 are patterned to form the source electrode S7, a source line, the drain electrode D7, and a drain line. The i-type semiconductor layer 14 is then patterned to form a memory element region.

Figure 27E:
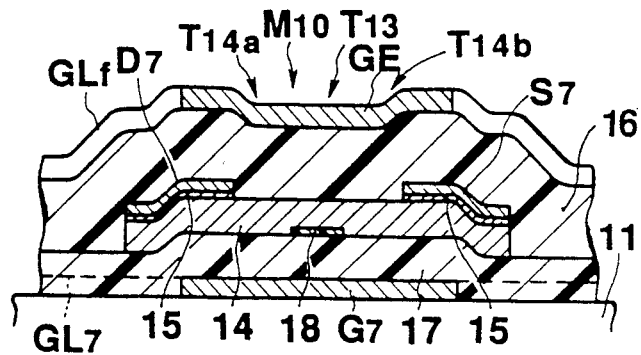

Subsequently, as shown in FIG. 27(E), the upper gate insulating film 16 and a metal film consisting of chromium or the like are sequentially deposited on the resultant structure throughout the upper surface of the substrate 11. The metal film is then patterned to form the read gate electrode GE and the read gate line GLf, thus completing the memory element M10.

Since each memory element M10 is designed such that the selection thin film transistors T14a and T14b are arranged on both sides of the memory transistor T13 in series, even if characteristics of one of the pair of the selection transistors T14a and T14b is defective, the other selection transistor can select and guard the memory transistor T13. Therefore, the reliability of the memory can be improved. In addition, the read gate electrodes G7 are respectively arranged for the memory transistor T13 and the selection transistors T14a and T14b, and a read operation is performed by applying a gate voltage to the read gate electrodes G7 of the selection transistors T14a and T14b and the memory transistor T13. This arrangement can eliminate changes in threshold voltage of the memory transistor T13 due to repetitive read operations, and hence semi-permanent, stable read operations can be performed.

Operations of matrix circuits respectively incorporating the above-described memory elements of the sixth and seventh embodiments will be described below.

Figure 28A:
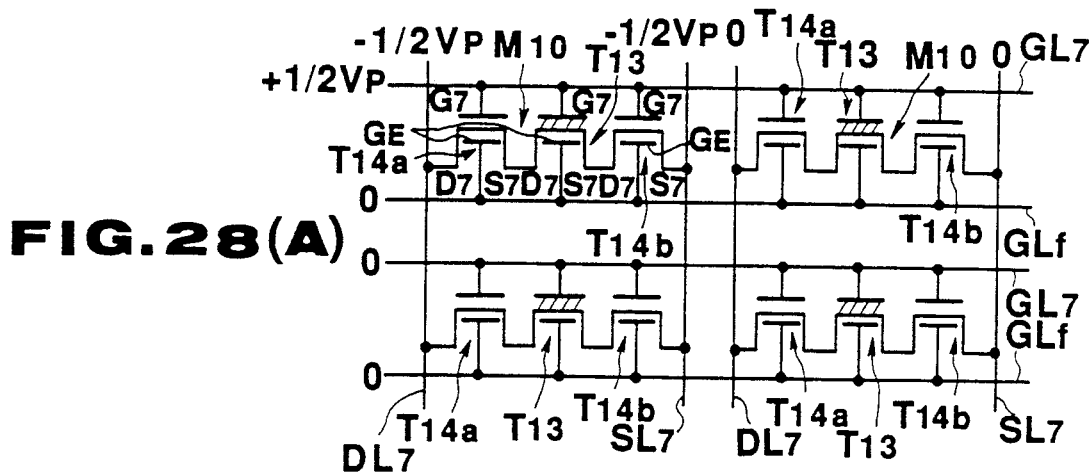
FIGS. 28(A) to 28(C) are circuit diagrams showing a matrix circuit of memory elements each of which is identical to the memory element in FIG. 26.
Figure 28B:
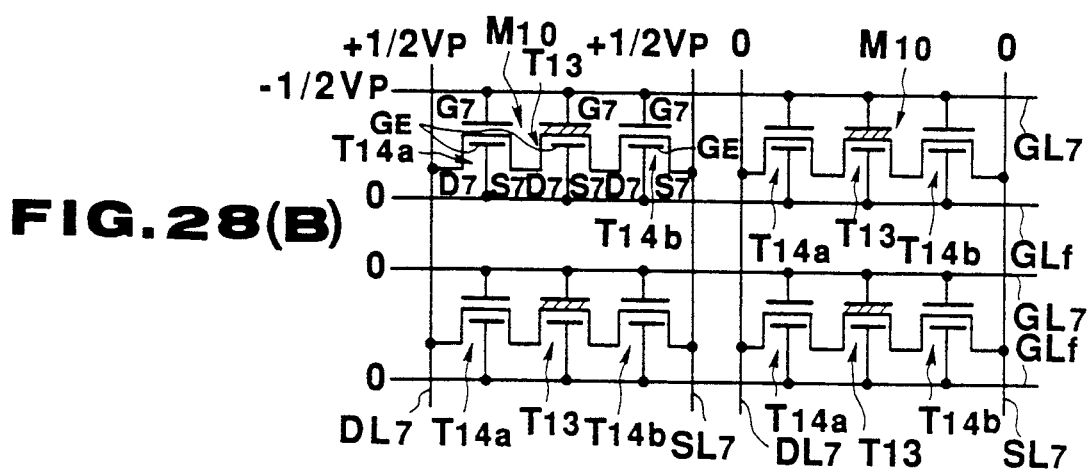
Figure 28C:
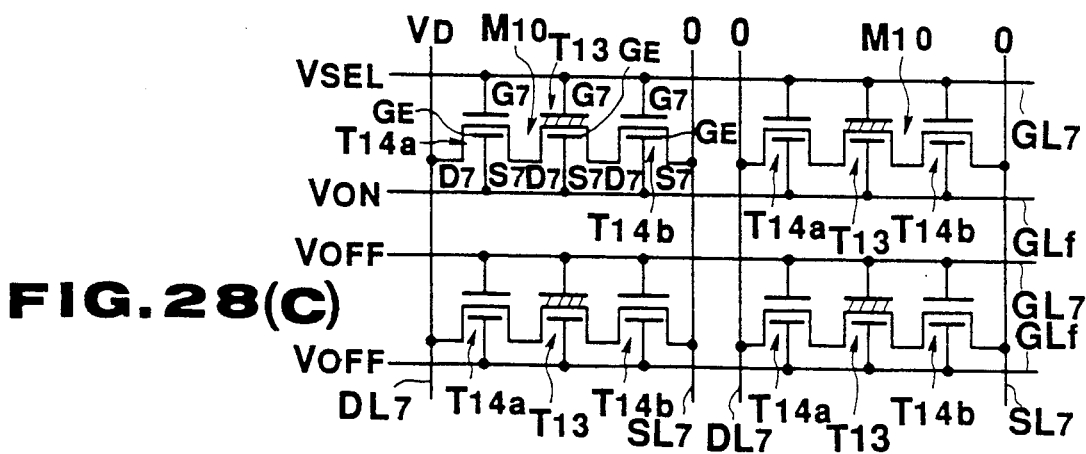

FIGS. 28(A) to 28(C) show a circuit in which the memory elements M10 are incorporated in the form of a 2×2 matrix.

Referring to FIGS. 28(A) to 28(C), reference symbol T13 denote the memory transistor; and T14a and T14b, the selection transistors which are paired to correspond to each memory transistor T13. This pair of the selection transistors T14a and T14b are respectively arranged on both the sides of the memory transistor T13. The gate electrodes G7 of the memory transistor T13 and the pair of the selection transistors T14a and T14b are respectively formed as write/erase gate electrodes, and the second gate electrodes for read operations (to be referred to as read gate electrodes hereinafter) GE are formed on the opposite side to the write/erase gate electrodes G7. The source electrode S7 of one selection thin film transistor T14a of the pair of the selection transistors T14a and T14b is integrated with the drain electrode D7 of the memory transistor T13, so that the transistor T14a is connected in series with the memory transistor T13. The drain electrode D7 of the other selection thin film transistor T14b is integrated with the source electrode S7 of the memory transistor T13, so that the transistor T14b is connected in series with the memory transistor T13. One memory element M10 is constituted by one pair of the selection transistors T14a and T14b and the memory transistor T13 arranged therebetween. Reference symbol GL7 denotes the write/erase gate line (address line); GLf, the read gate line (address line); and SL7 and DL7, the source and drain lines (data lines), respectively. The gate lines GL7 and GLf and the source drain lines SL7 and DL7 are perpendicular to each other in the form of a matrix. The memory elements M10 are respectively arranged at intersections defined by the gate lines GL7 and GLf and the source and drain lines SL7 and DL7. The write/erase gate electrodes G7 of each memory transistor T13 and the corresponding selection transistors T14a and T14b are connected to the corresponding common write/erase gate line GL7. In each memory element M10, the drain electrode D7 of one selection transistor T14a is connected to the corresponding drain line DL7, and the source electrode S7 of the other selection transistor T14b is connected to the corresponding source line SL7.

Write, erase, and read operations of the memory elements M10 are performed in the following manner. FIGS. 28(A) to 28(C) respectively show voltage application states in write, erase, and read modes. Note that each of FIGS. 28(A) to 28(C) shows a state wherein the upper left memory element M10 in the drawing is to be selected.

A write operation will be described first. In the write mode, as shown in FIG. 28(A), a positive voltage $+\frac{1}{2} V_P$ (+20 V) corresponding to $\frac{1}{2}$ a write/erase voltage $V_P$ (e.g., 40 V) of the memory transistor T13 is applied to the write/erase gate line GL7 of the gate lines GL7 and GLf to be selected. The potential of the read gate line GLf is set to be 0 (grounded). At the same time, a negative voltage $-\frac{1}{2} V_P$ (−20 V) corresponding to $\frac{1}{2}$ the write/erase voltage $V_P$ is applied to each of the source and drain lines SL7 and DL7 to be selected. In addition, the potentials of the non-selected gate lines GL7 and GLf and the source and drain lines SL7 and DL7 are set to be 0. When such voltage signals area applied, the selection transistors T14a and T14b of the selected memory element M10 at the intersection defined by the selected gate lines GL7 and GLf and the selected source and drain lines SL7 and DL7 is turned on upon voltage application to the write/erase gate electrode G7. As a result, a potential difference corresponding to the write/erase voltage $V_P$ is generated between the write/erase gate electrode G7 and the source and drain electrodes S7 and D7 of the memory transistor T13, and this memory transistor T13 is set in a write enable state. In another non-selected memory element M10 on the selected gate lines GL7 and GLf, since the potential difference between the write/erase gate electrode G7 and the source and drain electrodes S7 and D7 of each of the memory and selection transistors T13, T14a, and T14b is only $\frac{1}{2} V_P$, the memory transistor T13 is in a write disable state. With regard to other memory elements on the non-selected gate lines GL7 and GLf, the lower left memory element in FIG. 28(A) has only a potential difference of $\frac{1}{2} V_P$ between the write/erase gate electrode G7 and the source and drain electrodes S7 and D7 of the memory transistor T13, similar to the above-mentioned non-selected memory element M10. Therefore, this memory transistor T13 is in a write disable state. In the lower right memory element in FIG. 28(A), similar to the above non-selected memory element M10, the potential difference between the write/erase gate electrode G7 and the source and drain electrodes S7 and D7 of the memory transistor T13 is 0 (no voltage application). That is, potentials of the gate, source, and drain of the memory transistor T13 are equal to each other. Therefore, this memory transistor T13 is in a write disable state.

In the erase mode, as shown in FIG. 28(B), a voltage $-\frac{1}{2} V_P$ is applied to the write/erase gate line GL7 of the gate lines GL7 and GLf to be selected, and the potential of the read gate line GLf to be selected is set to be 0. At the same time, a voltage $+\frac{1}{2} V_P$ is applied to each of the source and drain lines SL7 and DL7 to be selected. Note that the same voltage signals as in the write mode are applied to the non-selected gate lines GL7 and GLf and the non-selected source and drain lines SL7 and DL7. Upon application of such voltage signals, a potential difference corresponding to the write/erase voltage $V_P$ and having a polarity opposite to it is generated between the write/erase gate electrode G7 and the source and drain electrodes S7 and D7 of the memory transistor T13 of the selected memory element M10. At this time, similar to the memory transistor T13, a voltage $-V_P$ is applied between the gate electrode G7 and the source and drain electrodes S7 and D7 of each of the selection transistor T14a and T14b on both the sides of the memory transistor T13. In a thin film transistor having a semiconductor layer consisting of amorphous silicon or polysilicon, even if a high negative voltage is applied to the gate electrode, the source-drain path is normally rendered conductive. That is, the thin film transistor is turned on. Therefore, the selection transistors T14a and T14b are turned on by the high negative voltage $-V_P$, and data held in the memory transistor T13 is erased. Similarly, in this case, since only a potential difference of $\frac{1}{2} V_P$ is generated between the write/erase gate electrode G7 and the source and drain electrodes S7 and D7 of the memory transistor T13 of the non-selected memory element M10, this memory transistor T13 is in an erase disable state.

Figures 29A, 29B, 29C:
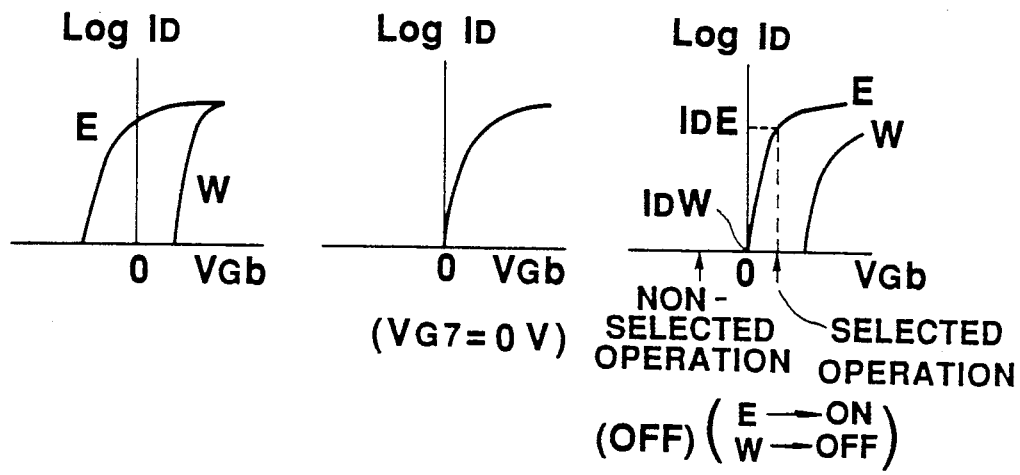
FIGS. 29(A) to 29(C) and 30(A) to 30(C) are graphs each showing drain current characteristics with respect to a voltage applied to a read gate electrode of the memory element in FIG. 26.
Figures 30A, 30B, 30C:
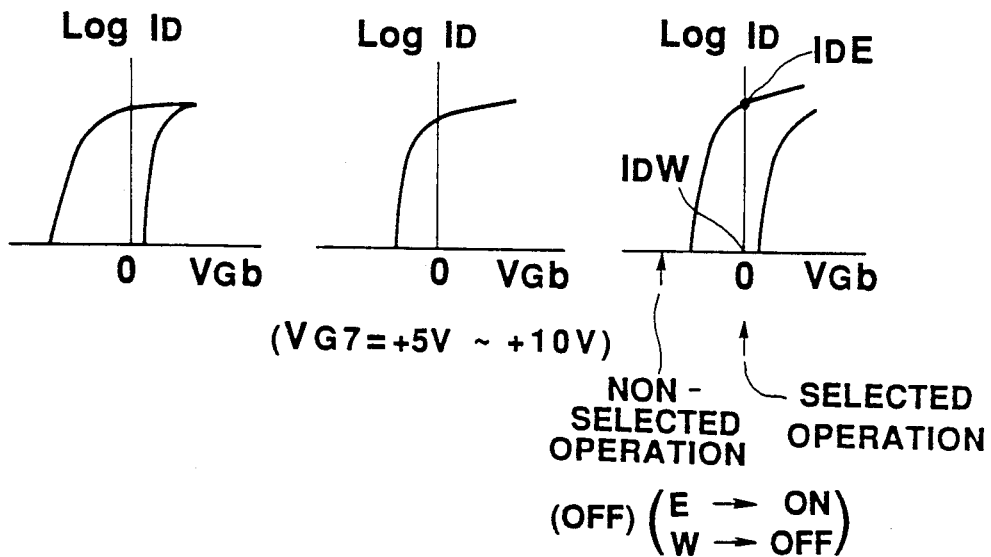

In the read mode, as shown in FIG. 28(C), a voltage $V_{ON}$ is applied to the read gate line GLf to be selected, and a voltage $V_{SEL}$ is applied to the write/erase gate line GL7 to be selected. At the same time, a voltage $V_D$ is applied to the drain line DL7 to be selected, and the potential of the source line SL7 to be selected is set be 0. Note that the voltages $V_{ON}$ and $V_D$ are sufficiently lower than the write/erase voltage $V_P(40 V)$ and are set as, e.g., $V_{ON}=10 V$ and $V_D=10 V$. The voltage $V_{SEL}$ is, for example, 0 V. In addition, a voltage $V_{OFF}$(e.g., 0 V) is applied to the non-selected read gate line and the non-selected write/erase gate line GL7, and the potentials of the non-selected source and drain lines SL7 and DL7 are set to be 0. Upon application of such voltage signals, the selection transistors T14a and T14b of the non-selected memory element M10 are turned on by the voltage $V_{ON}$ applied to the read gate line GLf. As a result, a current flows from the drain line DL7 to the source line SL7 in accordance with data held in the memory transistor T13 and is output as readout data. In this case, since the memory transistor T13 and the pair of the selection transistors T14a and t14b are connected in series, the characteristics of a drain current $I_D$ with respect to a voltage $V_{Gb}(V_{On})$ applied to the read gate electrode GE of the selected memory element M10 ($V_{Gb}-I_D$ characteristics) are the total characteristics of the respective transistors T13, T14a, and T14b. Therefore, readout data is determined by the total characteristics of the respective transistors T13, T14a, and T14b. FIGS. 19(A) to 19(C) show the $V_{Gb}-I_D$ characteristics of the selected memory element M10 obtained when a voltage $V_{G7}$ ($V_{SEL}$ to be applied to the write/erase gate electrode G7 is set to be 0 V. FIG. 29(A) shows the $V_{Gb}-I_D$ characteristics of the memory transistor T13; FIG. 29(B), the $V_{Gb}-I_D$ characteristics of the selection transistors T14a and T14b; and FIG. 29(C), the total $V_{Gb}-I_D$ characteristics of the respective transistors T13, T14a, and T14b. Referring to FIGS. 29(A) to 29(C), reference symbol W denotes characteristics in a write state; and E, characteristics in an erase state. While the memory element M10 is read-selected, the drain current $I_D$ becomes a current $I_{DE}$ when the memory transistor T13 is in an erase state, and becomes a current $I_{DW}(0 A)$ when the memory transistor T13 is in a write state. That is, in a selected operation, the memory element M10 is turned on in an erase state, and is turned off in a write state. While the memory element M10 is not selected, the selection transistors T14a and T14b are turned off by the voltage $V_{OFF}$ applied to the write/erase gate line GL7 and the read gate line GLf. For this reason, the memory element M10 is in OFF state regardless of an erase or write state. FIGS. 30(A) to 30(C) show the $V_{Gb}-I_D$ characteristics of the selected memory element M10 obtained when the voltage $V_{G7}$ ($V_{SEL}$) applied to the write/erase gate electrode G7 is set to be +5 V to +10 V (a voltage small enough to cause no change in erase/write state of the memory transistor T13). FIG. 30(A) shows the $V_{Gb-ID}$ characteristics of the memory transistor T13; FIG. 30(B), the $V_{Gb}-I_D$ characteristics of the selection transistors T14a and T14b; and FIG. 30(C), the total $V_{Gb}-I_D$ characteristics of the respective transistors T13, T14a, and T14b. As shown in FIGS. 30(A) to 30(C), if a voltage of a certain level (+5 V to +10 V) is applied to the write/erase gate electrode G7, the $V_{Gb}-I_D$ characteristics of the memory transistor T13 and the selection transistors T14a and T14b are shifted to the negative side. As a result, the total $B_{Gb}-I_D$ characteristics are also shifted to the negative side. Therefore, while the memory transistor T13 is in an erase state, the drain current $I_{DE}$ can be increased. Note that in this case, a voltage to be supplied to the read gate line GLb in a read or read nonselection operation is shifted to the negative side by the shift amount of the characteristics.

In either of the write, erase, and read modes, the voltages applied to the selected source and drain lines SL7 and DL7 are also applied to the non-selected memory element M10 on the same source and drain lines SL7 and DL7. However, since each of the selection transistors T14a and T14b of the non-selected memory element M10 has a gate potential corresponding to the negative voltage $-\frac{1}{2}V_P$ or $V_{OFF}(0 V)$, i.e., are set in an OFF state, the memory transistor T13 of the non-selected memory element M10 is not influenced by the applied voltages. That is, in this memory element M10, the selection transistors T14a and T14b serve not only as transistors for selecting the memory transistor T13, but also as guard transistors for guarding the memory transistor T13 from voltages applied in a non-selection operation.

As has been described above, according to the present invention, there is provided a memory element which allows a reduction in formation area of the memory element, and greatly improves the reliability.

In each of the above-described embodiments, with regard to the operation of the matrix circuit, erase and write operations are relative to each other. Therefore, in each embodiment, an erase operation may be understood as a write operation, and vice versa.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A memory cell system, comprising:
   a substrate;
   a thin film memory element formed on said substrate and including
   a semiconductor layer,
   a source electrode and a drain electrode electrically coupled to said semiconductor layer and separated from one another so as to form a channel region,
   a first gate insulating layer and a second gate insulating layer formed on said semiconductor layer, and
   a first gate electrode and a second gate electrode electrically coupled to said first and said second gate insulating layers respectively, said first gate insulating layer having charge-trapping means for trapping charges when a write/erase voltage +Vp/−Vp is applied between said first gate electrode and said source electrode, said second gate insulating layer having no charge-trapping means;
   write/erase means for applying the write/erase voltage +Vp/−Vp between said first gate electrode and said source electrode; and
   read means for applying a read voltage between said second gate electrode and said source electrode while no voltage is applied between said first gate electrode and said source electrode.

2. The memory cell system according to claim 1, wherein said first gate insulating layer comprises a thin portion formed of silicon nitride and serving as said charge-trapping means, and thick portions that are incapable of trapping charges.

3. The memory cell system according to claim 2, wherein said thin portion is located in a middle region of said first gate insulating layer, and said thick portions are located one on either side of said thin portion.

4. The memory cell system according to claim 1, wherein said first gate insulating layer comprises a first portion formed of silicon nitride having a Si/N composition ratio that is greater than a stoichiometric ratio and said first portion is directly coupled to said semiconductor layer.

5. The memory cell system according to claim 4, wherein said first gate insulating layer comprises second portions being incapable of trapping charges.

6. The memory cell system according to claim 4, wherein said first portion is located in a middle region of said first gate insulating layer, and said second portions are located one on either side of said first portion.

7. A memory cell system comprising:
a substrate;
a thin film memory transistor formed on said substrate and including
a first thin semiconductor layer having a source region and a drain region,
a first gate insulating layer and a second gate insulating layer formed on said first semiconductor layer, and
a first gate electrode and a second gate electrode respectively formed on said first and said second gate insulating layers, said first gate insulating layer having charge-trapping means for trapping charges when a write/erase voltage $+Vp/-Vp$ is applied between said first gate electrode and said source region, said second gate insulating layer having no charge-trapping means;
a thin film select transistor arranged on one side of said memory transistor and electrically coupled to said memory transistor so as to select said memory transistor, said select transistor including
a second thin semiconductor layer having a source region and a drain region,
a third gate insulating layer formed on said second semiconductor layer, and
a third gate electrode, said third gate insulating layer having no means for trapping charges when a voltage ranging from $-Vp$ to $+Vp$ is applied between said second gate electrode and said source region;
write/erase means for applying a write/erase voltage $+Vp/-Vp$ between said first gate electrode and said source region of said memory transistor; and
read means for applying a read voltage between said second gate electrode and the source region of said transistor, and between said third gate electrode and said source region of said select transistor, while no voltage is applied between said first gate electrode and the source region of said memory transistor.

8. A memory cell system, comprising:
a substrate;
a thin film memory element formed on said substrate and including
a semiconductor layer having two surfaces,
source and drain regions formed separately from one another so as to define a space for a channel region,
a first gate insulating layer coupled to one of said two surfaces of said semiconductor layer,
a first gate electrode formed on said first gate insulating layer and having regions which correspond to said source and said drain regions, respectively,
a second gate insulating layer coupled to the other of said two surfaces of said semiconductor layer, and
a second gate electrode formed on said second gate insulating layer, said first gate insulating layer having charge-trapping means for trapping charges when a write/erase voltage $+Vp/-Vp$ is applied between said first gate electrode and said source region, said second memory gate insulating layer having no charge-trapping means;
write/erase means for applying the write/erase voltage $+vs/-Vp$ between said first gate electrode and said source region; and
read means for applying a read voltage between said second gate electrode and said source region while no voltage is applied between said first gate electrode and said source region.

9. The memory cell system according to claim 8, wherein said first gate insulating layer comprises a thin portion formed of silicon nitride and serving as said charge-trapping means, and thick portions that are incapable of trapping charges.

10. The memory cell system according to claim 9, wherein said thin portion is located in a middle region of said first gate insulating layer, and said thick portions are located one on either side of said thin portion.

11. The memory cell system according to claim 8, wherein said first gate insulating layer comprises a first portion formed of silicon nitride having a Si/N composition ratio that is greater than a stoichiometric ratio and said first portion is directly coupled to said semiconductor layer.

12. The memory cell system according to claim 11, wherein said first gate insulating layer comprises second portions being incapable of trapping charges.

13. The memory cell system according to claim 11, wherein said first portion is located in a middle region of said first gate insulating layer, and said second portions are located one on either side of said first portion.

* * * * *

UNITED STATES PATENT AND TRADEMARK OFFICE
CERTIFICATE OF CORRECTION

PATENT NO. : 5,057,885
DATED : October 15, 1991
INVENTOR(S) : MATSUMOTO et al

It is certified that error appears in the above-identified patent and that said Letters Patent is hereby corrected as shown below:

TITLE PAGE item [30] Foreign Application Priority Data:

Change "Japan...1-19432" to read --Japan...1-194032--.

Signed and Sealed this

Fifteenth Day of June, 1993

Attest:

MICHAEL K. KIRK

Attesting Officer

Acting Commissioner of Patents and Trademarks